(12) United States Patent
Takahashi et al.

(10) Patent No.: US 8,514,632 B2
(45) Date of Patent: Aug. 20, 2013

(54) SEMICONDUCTOR MEMORY INCLUDING PROGRAM CIRCUIT OF NONVOLATILE MEMORY CELLS AND SYSTEM

(75) Inventors: Motoi Takahashi, Yokohama (JP); Yasuharu Sato, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 177 days.

(21) Appl. No.: 13/022,410

(22) Filed: Feb. 7, 2011

(65) Prior Publication Data

US 2011/0205808 A1      Aug. 25, 2011

(30) Foreign Application Priority Data

Feb. 22, 2010   (JP) .................................. 2010-036110

(51) Int. Cl.
   *G11C 16/06*   (2006.01)
(52) U.S. Cl.
   USPC ............ 365/185.23; 365/185.11; 365/185.17; 365/185.26; 365/185.28
(58) Field of Classification Search
   USPC ............. 365/185.11, 185.17, 185.23, 185.26, 365/185.28
   See application file for complete search history.

(56) References Cited

U.S. PATENT DOCUMENTS

| | | |
|---|---|---|
| 5,999,444 A | 12/1999 | Fujiwara et al. |
| 6,014,328 A * | 1/2000 | Onakado et al. ......... 365/185.05 |
| 6,567,305 B2 | 5/2003 | Nakamura |
| 6,771,536 B2 | 8/2004 | Li et al. |
| 6,937,514 B2 * | 8/2005 | Hasegawa ................ 365/185.12 |
| 7,050,344 B1 * | 5/2006 | Cho et al. ....................... 365/201 |
| 2005/0135155 A1 * | 6/2005 | Ishimaru et al. ......... 365/185.25 |
| 2005/0141298 A1 * | 6/2005 | Lee et al. ....................... 365/200 |
| 2006/0072358 A1 * | 4/2006 | Kang et al. ................ 365/185.2 |
| 2009/0180320 A1 * | 7/2009 | Torii et al. ................ 365/185.05 |

FOREIGN PATENT DOCUMENTS

| | | |
|---|---|---|
| JP | 2001-351392 A | 12/2001 |
| JP | 2004-30866 A | 1/2004 |
| JP | 2005-346819 | 12/2005 |
| JP | 2006-157050 A | 6/2006 |
| JP | 2008-226332 A | 9/2008 |

* cited by examiner

*Primary Examiner* — Hoai V Ho
(74) *Attorney, Agent, or Firm* — Arent Fox LLP

(57) ABSTRACT

A semiconductor memory includes a plurality of nonvolatile memory cells arranged in a matrix and coupled to control gate lines, selection gate lines, bit lines, and source lines, and includes a source line control unit. The source line control unit, at a time of program operation, sets one of the source lines coupled to a row of the memory cells including a program memory cell to a high level voltage, and sets at least one of the remaining source lines coupled to a row of a non-program memory cells to be higher than a low level voltage of the selection gate lines and to be lower than the high level voltage of an unselection bit line. Thereby, a leak current lowering a voltage of the source lines at the time of program operation can be blocked off, and a program operation time may be shortened.

14 Claims, 22 Drawing Sheets

|  |  |  | RD | PGM | ERS |
|---|---|---|---|---|---|
| selected sector | selected line | CG0 | 1.8V | 9V | -9V |
| | | SG0 | 1.8V | 4V | FLT |
| | | SL0 | 0V | 5V | FLT |
| | | BL0 | 1.8V | 0V | FLT |
| | unselected line | CG1-15 | 1.8V | 0V | -9V |
| | | SG1-15 | 0V | 0V | FLT |
| | | SL1-7 | 0V | FLT | FLT |
| | | BL1-1023 | 0V | FLT | FLT |
| | | PW0 | 0V | 0V | 9V |
| unselected sector | | CG0-15 | 1.8V | 0V | FLT |
| | | SG0-15 | 0V | 0V | FLT |
| | | SL0-7 | 0V | 0V | FLT |
| | | BL0-1023 | 0V | 0V | FLT |
| | | PW1-3 | 0V | 0V | 0V |

FIG. 7

|  |  |  | RD | PGM | ERS |
|---|---|---|---|---|---|
| selected sector | selected line | CG0 | 1.8V | 9V | -9V |
|  |  | SG0 | 1.8V | 4V | FLT |
|  |  | SL0 | 0V | 5V | FLT |
|  |  | BL0 | 1.8V | 0V | FLT |
|  | unselected line | CG1-15 | 1.8V | 0V | -9V |
|  |  | SG1-15 | 0V | 0V | FLT |
|  |  | SL1-7 | 0V | 1.8V | FLT |
|  |  | BL1-1023 | 0V | FLT | FLT |
|  |  | PW0 | 0V | 0V | 9V |
| unselected sector |  | CG0-15 | 1.8V | 0V | FLT |
|  |  | SG0-15 | 0V | 0V | FLT |
|  |  | SL0-7 | 0V | 0V | FLT |
|  |  | BL0-1023 | 0V | 0V | FLT |
|  |  | PW1-3 | 0V | 0V | 0V |

SEMICONDUCTOR MEMORY INCLUDING PROGRAM CIRCUIT OF NONVOLATILE MEMORY CELLS AND SYSTEM

CROSS-REFERENCE TO RELATED APPLICATION

This application is based upon and claims the benefit of priority from Japanese Patent Application No. 2010-036110, filed on Feb. 22, 2010, the entire contents of which are incorporated herein by reference.

FIELD

The present embodiments relate to a semiconductor memory including an electrically rewritable nonvolatile memory cells, and to a system including the semiconductor memory.

BACKGROUND

There is known a semiconductor memory such as a flash memory having memory cells that is arranged in a matrix and is coupled to a control gate line, a selection gate line, a bit line, and a source line. Setting the control gate line, the selection gate line, the bit line, and the source line to predetermined voltages allows a program operation, an erasure operation, and a read operation of the memory cell to be executed. For example, generating hot electrons with a current fed from the source line to the bit line via a selection transistor and a memory transistor which receive a high level at a control gate and injecting the generated hot electrons into a floating gate of the memory cell arrow the program operation to be executed. Related arts are discussed in Japanese Laid-open Patent Publication No. 2008-226332, No. 2006-157050, No. 2004-30866, and No. 2001-351392.

In the program operation, if a voltage of the source line, to be set to a high level, coupled to the memory cell where data are to be programmed drops due to a leak current of the selection transistor coupled to the memory cell where data are not to be programmed, the hot electrons may not sufficiently be generated, and a program operation time may be long.

SUMMARY

According to an aspect of the embodiment, a semiconductor includes a plurality of nonvolatile memory cells being arranged in a matrix and including memory transistors which are electrically rewritable and selection transistors coupled to the respective memory transistors; a plurality of control gate lines each coupled to a row of the memory cells aligned in a first direction; a plurality of selection gate lines each coupled to the row of the memory cells aligned in the first direction; a plurality of source lines each coupled to the row of the memory cells aligned in the first direction; a plurality of bit lines each coupled to a row of the selection transistors aligned in a second direction intersecting the first direction; a control gate line driver setting one of the control gate lines coupled to the row of the memory cells including a program memory cell where data are programmed to a first high level voltage, and setting at least one of the remaining control gate lines coupled to the row of non-program memory cells where data are not programmed to a low level voltage, at a time of program operation; a selection gate line driver setting one of the selection gate lines coupled to the row of the memory cells including the program memory cell to a second high level voltage, and setting at least one of the remaining selection gate lines coupled to the row of the non-program memory cells to a low level voltage, at the time of program operation; a bit line control unit setting one of the bit lines coupled to the row of the selection transistors including the program memory cell to a low level voltage, and setting at least one of the remaining bit lines coupled to the row of the selection transistors where data are not programmed to a floating state, at the time of program operation; and a source line control unit setting one of the source lines coupled to the row of the memory cells including the program memory cell to a third high level voltage, and setting at least one of the remaining source lines coupled to the row of the non-program memory cells to be higher than the low level voltage of the selection gate lines and to be lower than a fourth high level voltage, on a floating bit line set to the floating state, generated by a current flowing into the floating bit line from one of the source lines set to the third high level voltage via the memory transistors and the selection transistors of the non-program memory cells, at the time of program operation.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 7 illustrates an example of voltages of signal lines at the time when the semiconductor memory illustrated in FIG. 2 operates;

FIG. 16 illustrates an example of voltages of signal lines at the time when a semiconductor memory having the source line control unit illustrated in FIG. 14 operates;

DESCRIPTION OF EMBODIMENTS

Figure 1:
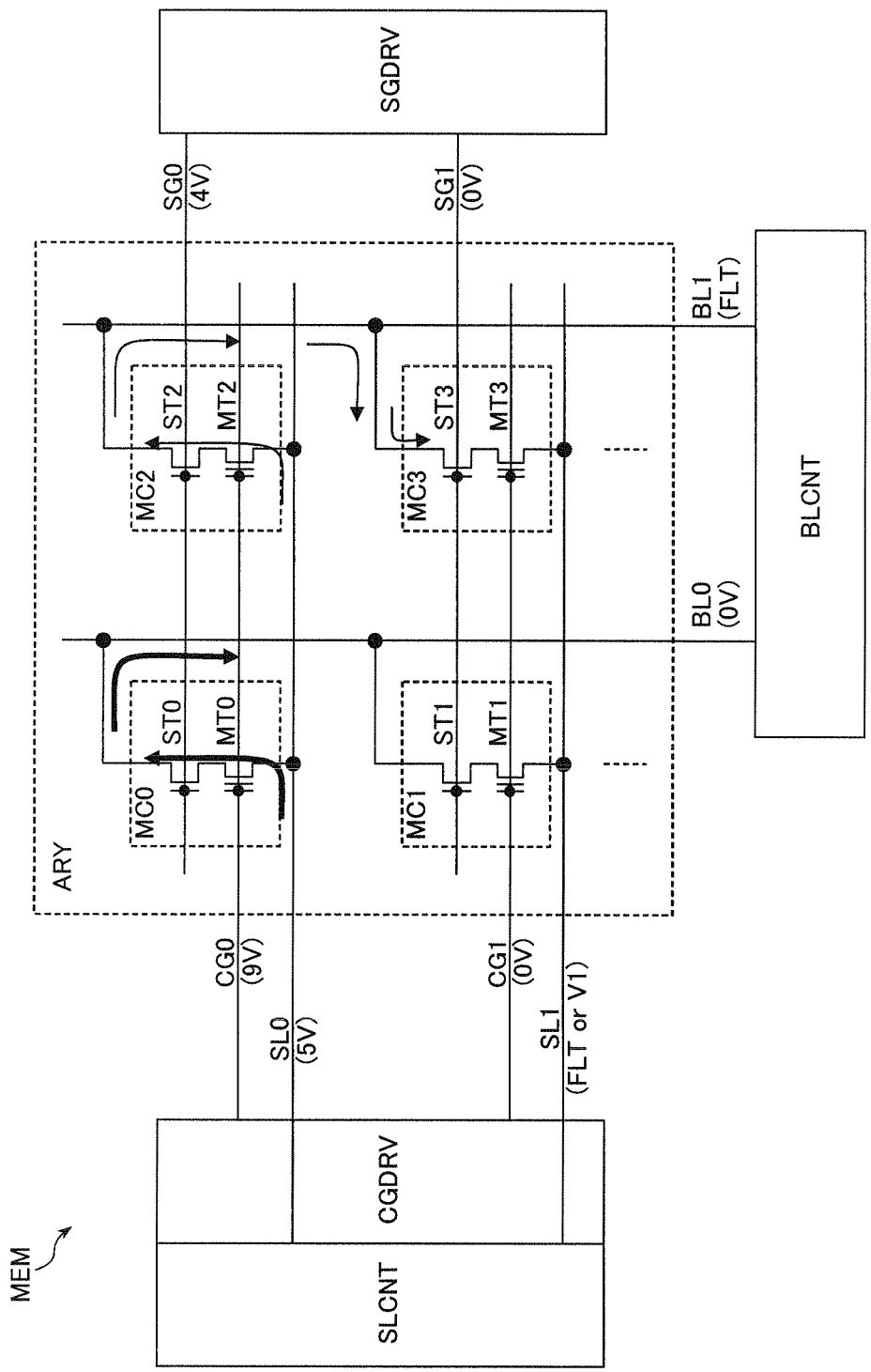
FIG. 1 illustrates an example of a semiconductor memory in one embodiment.

Hereinafter, embodiments are described using figures. A signal line transmitting a signal therethrough has the same reference character given as the signal name. A double square mark in a figure illustrates an external terminal. The external terminal is, for example, a pad on a semiconductor chip, or a lead of a package with the semiconductor chip mounted therein. A signal supplied through the external terminal has the same reference character as a terminal name used.

FIG. 1 illustrates an example of a semiconductor memory MEM in one embodiment. For example, the semiconductor memory MEM is a NOR-type flash memory. The semiconductor memory MEM may operate in synchronization with a clock signal, and may operate in asychronization with the clock signal. An arrow in the figure illustrates that a current flows through a signal line and a transistor. A thick arrow illustrates that the current is large.

The semiconductor memory MEM includes a source line control unit SLCNT, a control gate line driver CGDRV, a bit line control unit BLCNT, a selection gate line driver SGDRV, and a memory cell array ARY. The memory cell array ARY has a plurality of nonvolatile memory cells MC (MC0-3) arranged in a matrix, and has control gate lines CG0-1, selection gate lines SG0-1, source lines SL0-1, and bit lines BL0-1, which are coupled to the memory cells MC.

Each of the memory cells MC (MC0-3) has an electrically rewritable memory transistor MT (MT0-3), a selection transistor ST (ST0-3) coupled to the memory transistor MT. For example, each memory transistor MT has a structure of an nMOS transistor, and has a floating gate injected electrons and a control gate coupled to the control gate line CG (CG0 or CG1). Each memory transistor MT may be formed using a trap gate with the electrons trapped in a prescribed location. The selection transistor ST is an nMOS transistor with a gate thereof coupled to the selection gate line SG.

The memory transistor MT, at the time of programming data of logic "0" therein, is selected using the corresponding selection transistor ST, and a threshold voltage thereof is set to be high by a program operation. On the other hand, in the memory transistor MT, when the data thereof is erased from logic "0" to logic "1", the threshold voltage thereof is set to be low by an erasure operation. Thereby, the logic of data held in the memory cell MC is electrically rewritable. For example, the threshold voltage of the memory transistor MT in the erasure state is set as negative. Setting the threshold voltage as negative in the erasure state may enable a voltage applied to the control gate line CG at the time of a read operation to be low. Making the voltage magnitude of the control gate line CG small may realize high speed read access of the memory cell MC.

The control gate lines CG0-1, the selection gate lines SG0-1 and the source lines SL0-1 are coupled to rows (MC0, MC2, or MC1, MC3) of the memory cells MC aligned in a first direction (horizontal direction in the figure), respectively. The bit lines BL0-1 are coupled to rows of the selection transistors (ST0-1 or ST2-3) in the memory cells MC (MC0-1 or MC2-3) aligned in a second direction (vertical direction in the figure) intersecting the first direction, respectively.

This example is described as that the memory cell MC0 illustrated with a thick broken line, in the program operation, is selected by the selection transistor ST0, and is set to logic "0". The memory cells MC0-3 are set to logic "1" (erasure state) before the program operation, and the threshold voltages of the memory transistors MT0-3 are low.

At the time of program operation, a selection gate line driver SGDRV sets the selection gate line SG0 coupled to a row (MC0, MC2) of the memory cells including the memory cell MC0 where data are programmed, to a high level voltage (for example, 4 V). At the time of program operation, the selection gate line driver SGDRV sets the selection gate line SG1 coupled to a row (MC1, MC3) of the memory cells where data are not programmed, to a low level voltage (for example, 0 V). At the time of program operation, the control gate line driver CGDRV sets the control gate line CG0 coupled to the row (MC0, MC2) of the memory cells including the memory cell MC0 where data are programmed, to the high level voltage (for example, 9 V). At the time of program operation, the control gate line driver CGDRV sets the control gate line CG1 coupled to the row (MC1, MC3) of the memory cells MC where data are not programmed, to the low level voltage (for example, 0 V).

At the time of program operation, the bit line control unit BLCNT sets the bit line BL0 coupled to a row (ST0-1) of the selection transistors ST including the memory cell MC0 where data are programmed, to the low level voltage (for example, 0 V). At the time of program operation, the bit line control unit BLCNT sets the bit line BL1 coupled to a row (ST2-3) of the selection transistors ST where data are not programmed therein, to a floating state FLT.

The source line control unit SLCNT, at the time of program operation, sets the source line SL0 coupled to the row (MC0, MC2) of the memory cells including the memory cell MC0 where data are programmed, to the high level voltage (for example, 5 V). The source line control unit SLCNT performs control for setting the source line SL1 coupled to the row (MC1, MC3) of the memory cells where data are not programmed, to a predetermined voltage. For example, the predetermined voltage is higher than the low level voltage (0 V) of the selection gate line SG1, and is lower than a voltage of the bit line BL1. Here, into the bit line BL1 in the floating state FLT, a current flows from the source line SL0 set to the high level voltage via the memory cell MC2 where data are not programmed, and the bit line BL1 rises to 3.5 V, for example.

For example, at the time of program operation, the source line control unit SLCNT sets the source line SL1 to the floating state FLT. The threshold voltage of the memory transistor MT3 in the erasure state is set as negative. Therefore, a current flows into the source line SL1 from the high level bit line BL1 via the memory transistor MT3, and a voltage of the source line SL1 in the floating state FLT rises.

The voltage of the source line SL1 rises until a gate-to-source voltage of the memory transistor MT3 becomes lower than the threshold voltage of the memory transistor MT3. In addition, the voltage of the source line SL1 rises due to a subthreshold leakage of the memory transistor MT3. Finally, the gate-to-source voltage of the memory transistor MT3 becomes a value lower by 1 V to 1.5 V than the threshold voltage of the memory transistor MT3 (for example, −0.5 V), and the subthreshold leakage almost disappears. The voltage of the source line SL1 rises up to 1.8 V and stays there, for example. That is, by a floating control of the source line control unit SLCNT, the voltage of the source line SL1 is set to a value higher than the low level voltage (0 V) of the control gate line CG1 and lower than the high level voltage (3.5 V) of the bit line BL1.

In this state, there is no current flowing from the source line SL0 into the bit line BL1 via the memory transistor MT2 and the selection transistor ST2. There is no current flowing from the bit line BL1 into the source line SL1 via the selection transistor ST3 and the memory transistor MT3. This may enable the high level voltage of the source line SL0 to be prevented from dropping due to a leak path including the bit line BL1 and the source line SL1. The high level voltage of the source line SL0 may be kept, thus a current flowing through the memory transistor MT0 may be prevented from decreasing, and hot electrons generated in the memory transistor MT0 may be prevented from decreasing. As a result, injection efficiency of the hot electrons into the floating gate may be improved. In other words, a data program operation time to the memory cell MC may be shortened.

In addition, the source line control unit SLCNT may have a driver circuit which drives directly the source line SL1 coupled to the row (MC1, MC3) of the memory cells where data are not programmed. Then, the driver circuit of the source line control unit SLCNT sets the voltage of the source line SL1 to a value V1 higher than the low level voltage (0 V) of the selection gate line SG1 and lower than the high level voltage (3.5 V) of the bit line BL1. Specifically, the voltage of the source line SL1 is set, by the driver circuit, to the value V1 (for example, 1 V to 2 V) which scarcely allows the subthreshold leakage to flow in the memory transistor MT3.

As mentioned above, the present embodiment may enable the high level voltage of the source line SL0 coupled to the memory cell MC0 where data are to be programmed to be prevented from dropping due to the leak current of the selection transistor ST3 and memory transistor MT3. As a result, the hot electrons generated in the memory transistor MT0 where data are to be programmed may be prevented from decreasing, and the program operation time may be shortened.

Figure 2:
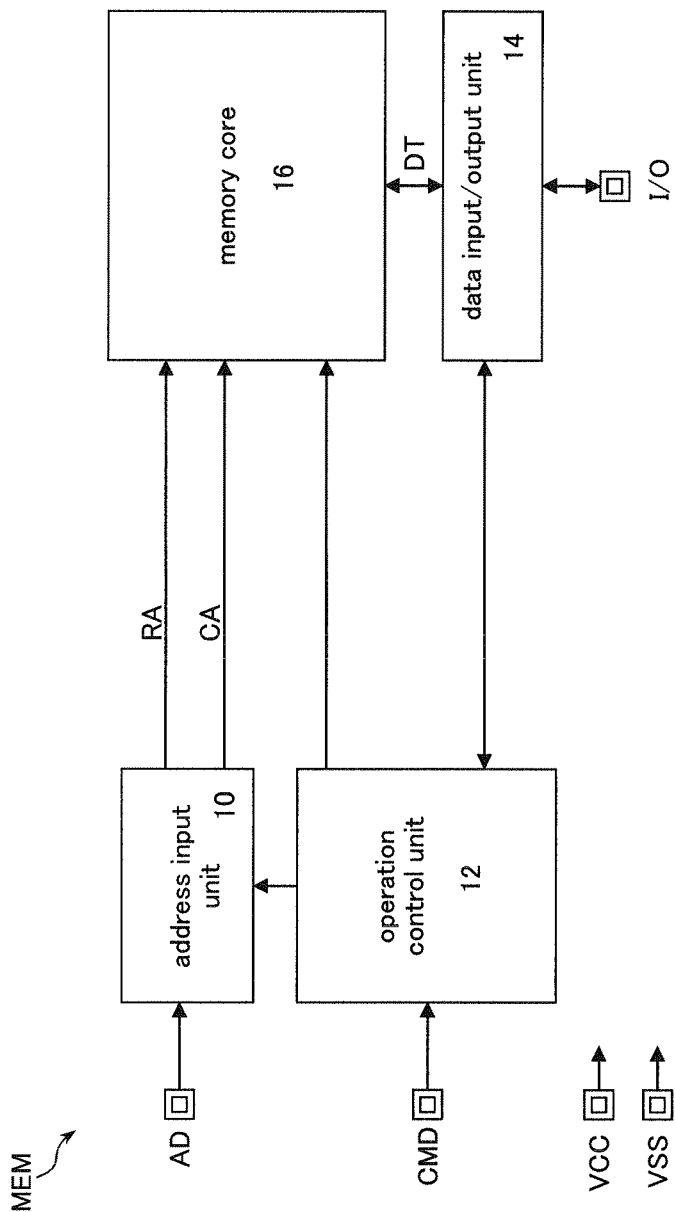
FIG. 2 illustrates an example of a semiconductor memory in another embodiment.

FIG. 2 illustrates an example of a semiconductor memory MEM in another embodiment. With respect to the same components as those described in the embodiment mentioned above, the same reference characters are given, and detailed descriptions thereof are omitted. The semiconductor memory MEM, for example, is a NOR type flash memory. The semiconductor memory MEM may operate in synchronization with a clock signal, and may operate in asynchronization with the clock signal.

Figure 6:
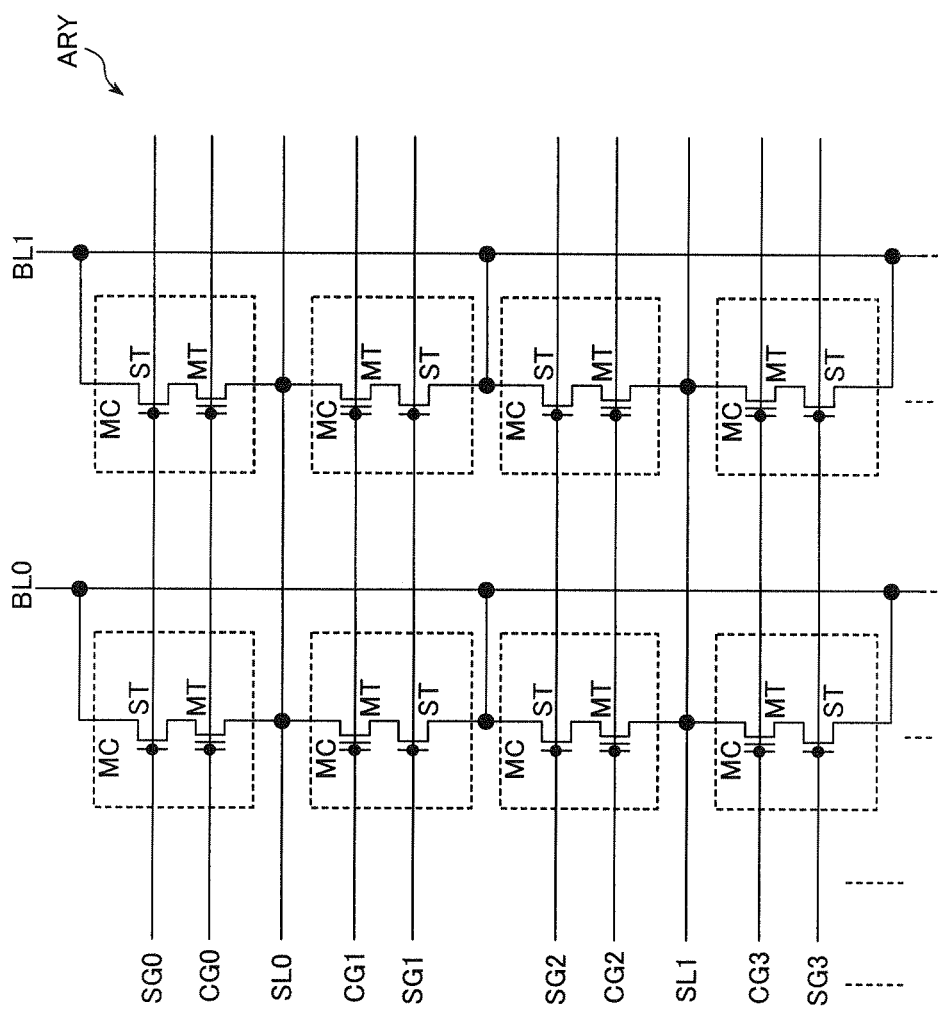
FIG. 6 illustrates an example of a memory cell array illustrated in FIG. 3.

The semiconductor memory MEM includes an address input unit 10, an operation control unit 12, a data input/output unit 14, and a memory core 16. The address input unit 10 receives an address signal AD at the time of the read operation, program operation and erasure operation, and outputs the received address signal AD to the memory core 16 as a row address signal RA and a column address signal CA. For example, the row address signal RA is allocated to a high order in the address signal AD, and is supplied to the semiconductor memory MEM for selecting the control gate line CG, selection gate line SG, and source line SL which are illustrated in FIG. 6. For example, the column address signal CA is allocated to a low order of the address signal AD, and is supplied to the semiconductor memory MEM for selecting the bit line BL illustrated in FIG. 6. Although not limited in particular, the address input unit 10 has a function which latches the logic of the address signal AD.

The operation control unit 12 receives, via an external terminal, a command signal CMD to access the memory core 16. For example, the command signal CMD includes a clock signal, a write enable signal, and a chip enable signal. Although not limited in particular, the command signal CMD includes a program command to execute the program operation, a read command to execute the read operation and an erasure command to execute the erasure operation. The operation control unit 12 generates control signals (timing signals) which controls, in response to the command signal CMD, operations of the address input unit 10, data input/output unit 14, and memory core 16.

At the time of program operation which sets the memory cell MC (FIG. 6) to logic "0", and at the time of erasure operation which sets the memory cell MC to logic "1", the operation control unit 12 monitors a threshold voltage of the selected memory cell MC based on verification data output from a read circuit in the memory core 16. When the threshold voltage has not reached an expected value, the operation control unit 12 outputs the control signal to the memory core 16 in order to continue the program operation or the erasure operation.

At the time of program operation which programs logic "0" in the memory cell MC, the operation control unit 12 receives, via the data input/output unit 14, the logic of a data signal supplied to the data terminal I/O. Then, the operation control unit 12 outputs the control signal to the memory core 16 in order to execute the program operation for the memory cell MC corresponding to the data terminal I/O supplied with logic "0" in the data terminal I/O which has a plurality of bits. In other words, the program operation is not executed for the memory cell MC corresponding to the data terminal I/O supplied with logic "1". At the time of read operation, the data input/output unit 14 outputs the logic of read data output from the memory core 16 to the data terminal I/O. The data input/output unit 14 outputs to the operation control unit 12, at the time of program operation, the logic of the data signal supplied to the data terminal I/O. Although not limited in particular, the data input/output unit 14 has a function which latches the logic of the data supplied to the data terminal I/O. The data input/output unit 14 has a function of the bit line control unit which sets up a voltage of the bit line BL. At the time of program operation, the bit line control unit sets, to the low level voltage, the bit line BL coupled to the row (the row of the selection transistors ST aligned in the wiring direction of the bit line BL in FIG. 6) of the memory cells MC including the memory cell MC where data are programmed. At the time of program operation, the bit line control unit sets, to the floating state FLT, the bit line BL coupled to the row (the row of the selection transistors ST aligned in the wiring direction of the bit line BL in FIG. 6) of the memory cells MC where data are not programmed. In the erasure operation which writes logic "1" in the memory cell MC, data of the memory cells MC in a sector SEC (FIG. 4) are erased in a lump, for example.

The memory core 16 includes the memory cell array ARY (FIG. 3, FIG. 6) which has the nonvolatile memory cells MC, a control circuit which control operations of the memory cell array ARY according to the control signal from the operation control unit 12 and a voltage generation unit. The control circuit is coupled to the voltage generation unit which generates high level voltages higher than an external power supply voltage VCC and negative voltages, based on the external power supply voltage VCC and a ground voltage VSS. Although not limited in particular, the external power supply voltage VCC is 1.8 V. An example of the memory core 16 is illustrated in FIG. 3.

Figure 3:
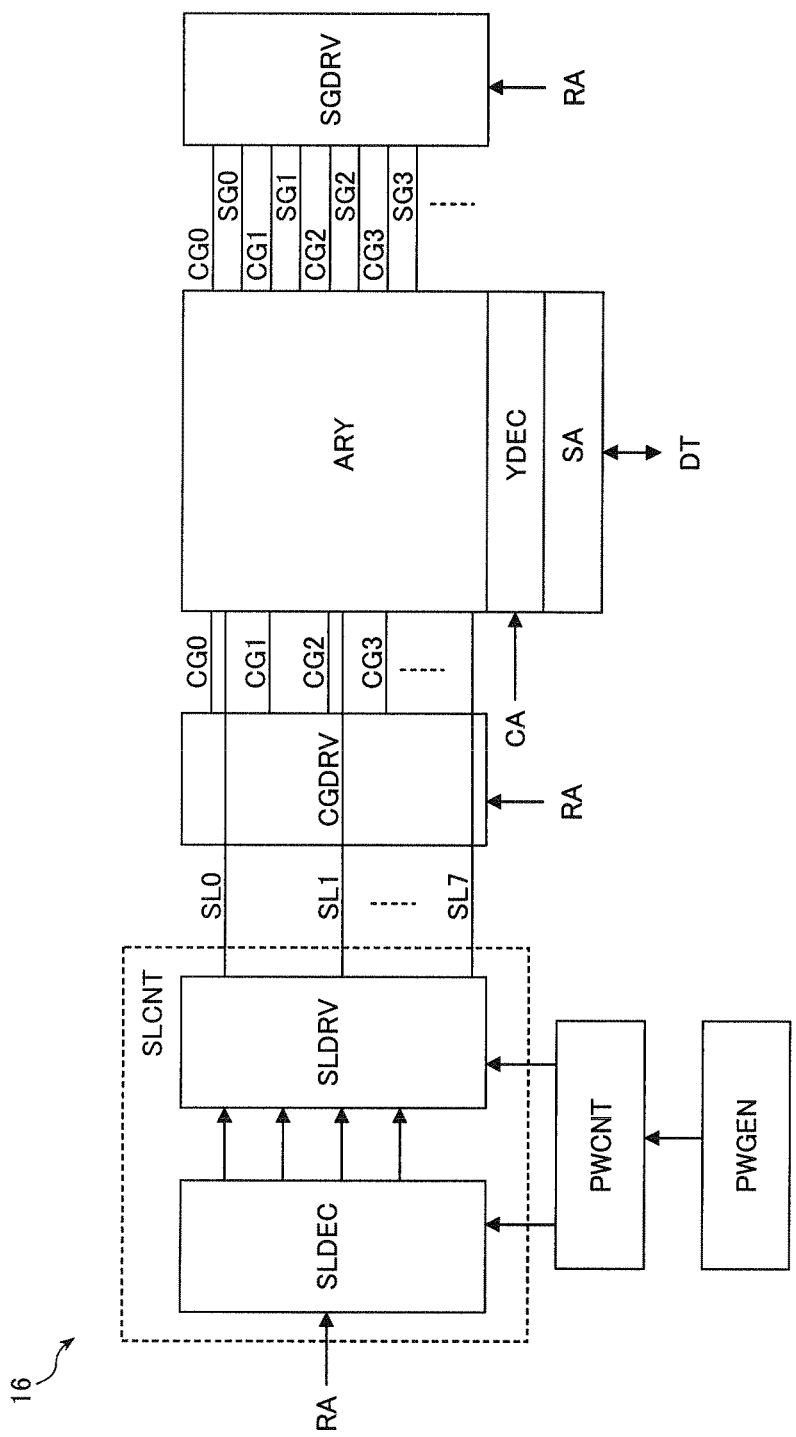
FIG. 3 illustrates an example of a memory core illustrated in FIG. 2.

FIG. 3 illustrates an example of the memory core 16 illustrated in FIG. 2. The memory core 16 includes a voltage generation unit PWGEN, a power control unit PWCNT, the source line control unit SLCNT, the control gate line driver CGDRV, the selection gate line driver SGDRV, a column decoder YDEC, a sense amplifier SA, and the memory cell array ARY.

The power control unit PWCNT is coupled to the voltage generation unit PWGEN. The power control unit PWCNT generates high level voltages supplied to a source line decoder SLDEC, a source line driver SLDRV, the control gate line driver CGDRV, and the selection gate line driver SGDRV, and generates negative voltages supplied to the control gate line driver CGDRV.

Figure 4:
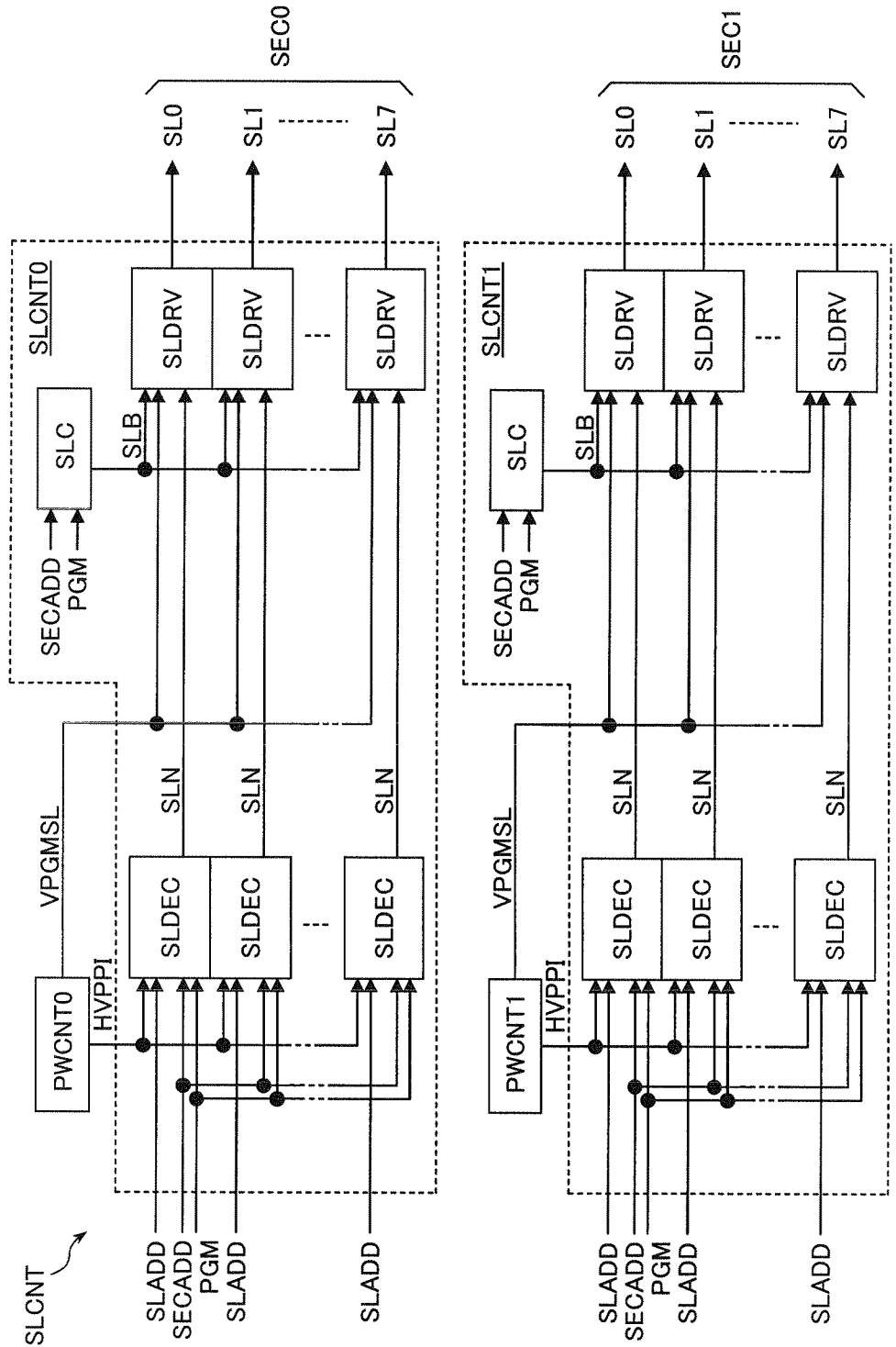
FIG. 4 illustrates an example of a power control unit and a source line control unit which are illustrated in FIG. 3.

The source line control unit SLCNT includes a plurality of source line decoders SLDEC and a plurality of source line drivers SLDRV. The source line decoders SLDEC output source line control signals in order to drive the source line drivers SLDRV corresponding to the source lines SL (SL0, SL1, ... SL7) which the row address signal RA indicates. The source line drivers SLDRV set the source lines SL each to predetermined voltages according to the source line control signals from the source line decoders SLDEC. An example of the source line control unit SLCNT is illustrated in FIG. 4.

The control gate line driver CGDRV drives the control gate lines CG (CG0, CG1, CG2, CG3, ... ) which the row address signal RA indicates. The selection gate line driver SGDRV drives the selection gate lines SG (SG0, SG1, SG2, SG3, ... ) which the row address signal RA indicates. The selection gate line driver SGDRV, utilizing decode logic of the selection gate line SG, selects the control gate line CG temporarily at the time of the program operation start. The selected control gate line CG is set to the power supply voltage VCC, for example, until the control gate line driver CGDRV starts an operation.

The column decoder YDEC outputs a column selection signal to select the bit line BL (FIG. 6) which the column address signal CA indicates. The column selection signal controls an operation of a column switch which couples the bit line BL to the sense amplifier SA.

The sense amplifier SA judges the logic of data output from the memory cell array ARY at the time of read operation and at the time of verification operation. The verification operation is executed at the time of erasure operation and at the time of program operation in order to verify the threshold voltage of the memory cell MC. The logic judged at the time of read operation is output to the data terminal I/O via the data line DT. The logic judged at the time of verification operation is output to the operation control unit 12 via the data line DT as the verification data.

FIG. 4 illustrates an example of the power control unit PWCNT and source line control unit SLCNT illustrated in FIG. 3. Hereinafter, circuits required for the program operation is described. The power control units PWCNT (PWCNT0-1) are formed corresponding to the sectors SEC (SEC0-1), respectively. At the time of program operation, for example, each of the power control units PWCNT supplies a high level voltage HVPPI and a program source voltage VPGMSL which are generated by the voltage generation unit PWGEN to the sector SEC where the program operation is executed. For example, the high level voltage HVPPI is set to 10 V in the sector SEC where the program operation is executed, and is set to 1.8 V in the sector SEC where the program operation is not executed. For example, the program source voltage VPGMSL is set to 5 V in the sector SEC where the program operation is executed, and is set to 0 V in the sector SEC where the program operation is not executed.

The voltage generation unit PWGEN illustrated in FIG. 3 has a charge pump which generates 10 V and 5 V from the power supply voltage VCC. Each of the power control units PWCNT0-1 operates for every sector SEC0-1 individually, which may enable power consumption to be reduced. The charge pump may be formed in each of the sectors SEC0-1. In this case, each power control unit PWCNT controls the charge pump of each of the sectors SEC0-1.

The source line control unit SLCNT includes, in each of the sectors SEC (SEC0-1), a source line control circuit SLC, and a plurality of the source line decoders SLDEC and a plurality of source line drivers SLDRV, which are corresponding to the source lines SL (SL0, SL1, ... SL7), respectively. The source line control units SLCNT0-1 are the same circuit mutually. Each of the number of the sectors SEC and the number of the source line control units SLCNT is not limited to two, and may be one, or three or more. The number of the source lines SL may be other than eight.

The source line control circuit SLC outputs a source control signal SLB according to a sector address SECADD and a program control signal PGM. For example, the sector address SECADD is generated by decoding high-order bits of the row address signal RA for selecting the sector SEC. When the semiconductor memory MEM has 16 sectors SEC, the sector address SECADD is the decoded signal of the most significant 4-bits of the row address signal RA. The program control signal PGM is output from the operation control unit 12 in response to the program command. For example, the source control signal SLB is set to either 1.8 V or 0 V.

Each of the source line decoders SLDEC, receiving the high level voltage HVPPI, a source line address SLADD, the sector address SECADD, and the program control signal PGM, outputs the source control signal SLN corresponding to each of the source lines SL (SL0-7). For example, the source line address SLADD is generated by decoding low-order bits of the row address signal RA. As illustrated in FIG. 6, each source line SL is wired along the control gate line CG, and is coupled to two memory cells MC in common. Therefore, the number of the source lines SL is a half of the number of the control gate lines CG and a half of the number of the selection gate lines SG.

For example, when each sector SEC has eight source lines SL, the source line address SLADD is the decoded signal of low-order 3 bits except the least significant bit of the row address signal RA. Besides, when the number of the source lines SL is the same as that of the control gate lines CG, the source line address SLADD is the decoded signal of the lowest 3 bits of the row address signal RA. For example, the source control signal SLN is set to either 10 V or 0 V.

Each of the source line drivers SLDRV, receiving the source control signal SLN, source control signal SLB, and program source voltage VPGMSL, sets the corresponding source line SL to a predetermined voltage.

Figure 5:
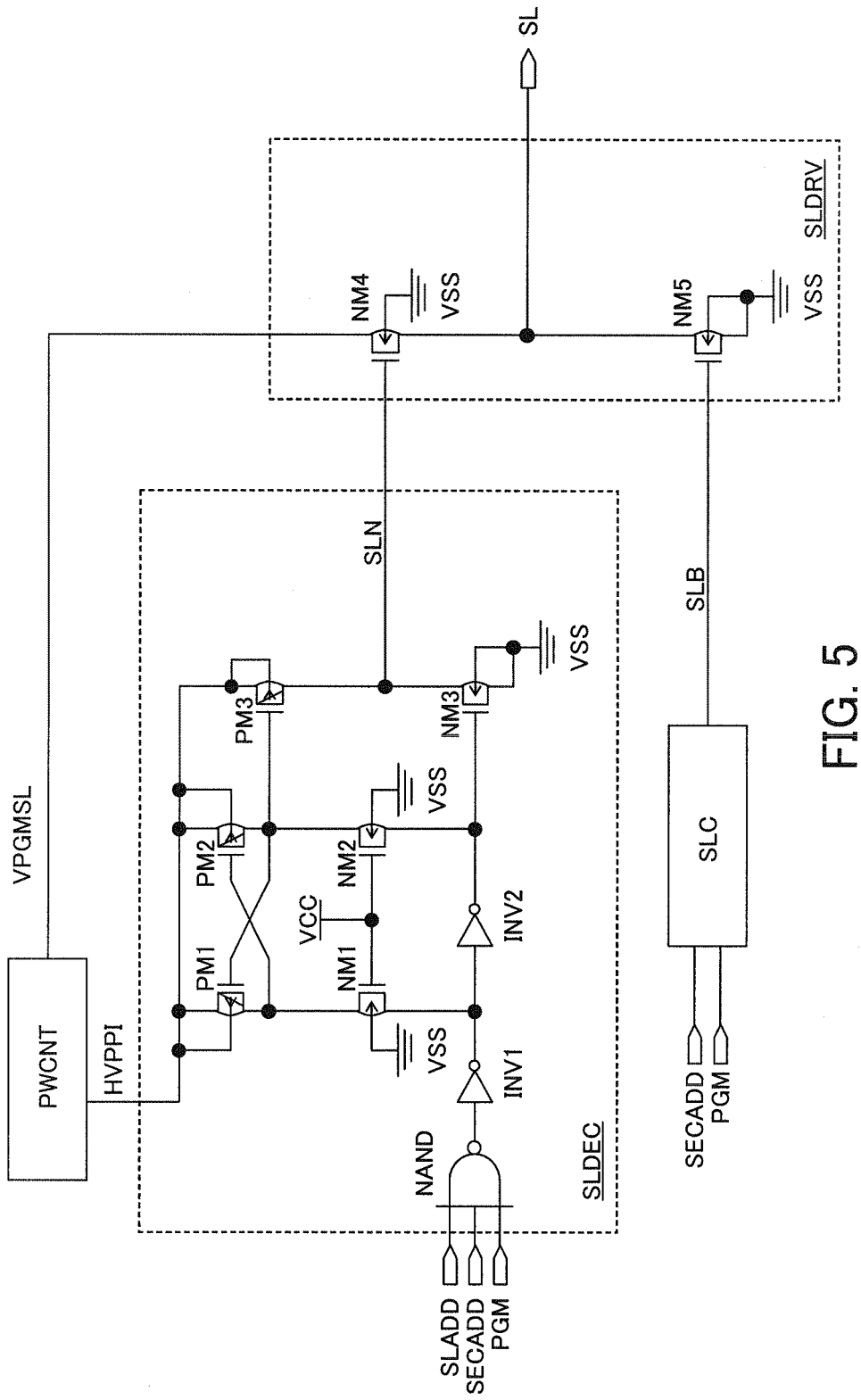
FIG. 5 illustrates an example of a source line decoder and a source line driver which are illustrated in FIG. 4.

FIG. 5 illustrates an example of the source line decoder SLDEC and source line driver SLDRV illustrated in FIG. 4. The source line decoder SLDEC includes a NAND gate, inverters INV1-2, pMOS transistors PM1-3, and nMOS transistors NM1-3. Breakdown voltages of the transistors PM1-3 and NM1-3 are designed high in comparison with the breakdown voltage of transistors forming the NAND gate and inverters INV1-2. The NAND gate and inverters INV1-2 are coupled in series. The NAND gate receives the source line address SLADD, sector address SECADD, and program control signal PGM.

The sources and back gates (substrates) of transistors PM1-3 are coupled to the high level voltage line HVPPI. The gate of the transistor PM1 is coupled to the drain of the transistor PM2, gate of the transistor PM3, and drain of the transistor NM2. The gate of the transistor PM2 is coupled to the drain of the transistor PM1 and drain of the transistor NM1. The source of the transistor NM1 is coupled to the output of the inverter INV1. The source of the transistor NM2 is coupled to the output of the inverter INV2 and gate of the transistor NM3. The back gates of the transistors NM1-3 are coupled to a ground line VSS. The source of the transistor NM3 is coupled to the ground line VSS. The drains of the transistors PM3 and NM3 are coupled to the source control signal line SLN.

The source line driver SLDRV includes nMOS transistors NM4-5. The transistor NM4 has the gate coupled to the source control signal line SLN, drain coupled to a program source voltage line VPGMSL, source coupled to the source line SL and back gate coupled to the ground line VSS. The transistor NM5 has the gate coupled to the source control signal line SLB, drain coupled to the source line SL, and the source and the back gate coupled to the ground line VSS.

The source line control circuit SLC corresponding to the sector SEC where the program operation is executed sets the source control signal SLB to the low level. The source line control circuit SLC corresponding to the sector SEC where the program operation is not executed sets the source control signal SLB to the high level (VCC).

In the source line decoder SLDEC corresponding to the source line SL coupled to the memory cell MC where the program operation is executed, outputs of the inverter INV1 and INV2 are set to the high level (VCC) and the low (VSS), respectively. Thereby, the transistors PM2 and NM3 are turned-off, and the transistors PM1 and PM3 are turned-on. The transistors NM1, NM2 are always "ON". When the transistor PM3 is turned-on, the source control signal SLN is set to the high level voltage (HVPPI; 10 V).

On the other hand, in the sector SEC where the program operation is executed, in the source line decoder SLDEC corresponding to the source line SL coupled to the memory cell MC where the program operation is not executed, outputs of the inverter INV1 and INV2 are set to the low level (VSS) and the high level (VCC), respectively. Thereby, the transistors PM2 and NM3 are turned-on, and the transistors PM1 and PM3 are turned-off. The transistors NM1, NM2 are always "ON". When the transistor NM3 is turned-on, the source control signal SLN is set to the low level voltage (VSS). Similarly, also in the source line decoder SLDEC corresponding to the sector SEC where the program operation is not executed, when the transistor PM3 is turned-off and the transistor NM3 is turned-on, the source control signal SLN is set to the low level voltage (VSS).

In the source line driver SLDRV corresponding to the source line SL coupled to the memory cell MC where the program operation is executed, receiving the source control signal SLN of the high-level, the transistor NM4 is turned-on, and receiving the source control signal SLB of the low level, the transistor NM5 is turned-off. Therefore, the source line SL is set to the high level (program source voltage VPGMSL; 5 V). On the other hand, in the sector SEC where the program operation is executed, in the source line driver SLDRV corresponding to the source line SL coupled to the memory cell MC where the program operation is not executed, receiving the source control signal SLN of the low-level, the transistor NM4 is turned-off, and receiving the source control signal SLB of the low level, the transistor NM5 is turned-off. Therefore, the source line SL is set to the floating state.

In the source line driver SLDRV corresponding to the sector SEC where the program operation is not executed, receiving the source control signal SLN of the low-level, the transistor NM4 is turned-off, and receiving the source control signal SLB of a high level, the transistor NM5 is turned-on. Therefore, the source line SL is set to the low level (VSS).

FIG. 6 illustrates an example of the memory cell array ARY illustrated in FIG. 3. The memory cell array ARY includes a plurality of the nonvolatile memory cells MC arranged in a matrix. The control gate lines CG (CG0-3), source lines SL (SL0-1), and selection gate lines SG (SG0-3) are coupled in common to rows of the memory cells MC aligned in a horizontal direction in the figure. The bit lines BL (BL0-1) are coupled in common to rows of the memory cells MC aligned in a vertical direction in the figure. Each source line SL is coupled in common to a pair of the memory cells MC arranged along the wiring direction (vertical direction in the figure) of the bit line BL. Each of the memory cells MC includes the memory transistor MT and selection transistor ST which are arranged in series between the source line SL and the bit line BL.

The memory transistor MT has a structure of an nMOS transistor, and has a floating gate injected electrons and a control gate coupled to the control gate line CG. The memory transistor MT may be formed using a trap gate having electrons trapped in a prescribed location. The selection transistor ST is an nMOS transistor with the gate thereof coupled to the selection gate line SG. The memory transistor MT and selection transistor ST have high breakdown voltages like the transistors NM1-5 illustrated in FIG. 5.

FIG. 7 illustrates an example of voltages of the signal lines at the time when the semiconductor memory MEM illustrated in FIG. 2 operates. In this example, in a read operation RD, data are read from the memory cell MC coupled to the control gate line CG0, selection gate line SG0, and bit line BL0 of the sector SEC0. In a program operation PGM, the memory cell MC coupled to the control gate line CG0, selection gate line SG0, and bit line BL0 of the sector SEC0 is set to logic "0". In an erasure operation ERS, all the memory cells MC in the sector SEC0 are set to logic "1". Therefore, in the erasure operation, all the control gate lines CG0-15 in the sector SEC0 are set to the negative voltage (for example, −9 V), and a p-type well region PW0 which is a substrate of the memory cells MC in the sector SEC0 is set to the high level (for example, 9 V). The P-type well region PW0 is the back gate (substrate) of the memory transistor MT and selection transistor ST.

In the program operation, the selected bit line BL0 in the selected sector SEC0 is set to the low level (0 V). The unselection bit lines BL1-1023 in the selected sector SEC0 are set to the floating state FLT. The number of the bit lines BL may not be 1024. In the program operation, only the control gate line CG0 coupled to the memory cell MC where data are programmed is set to the high level (9 V). Thereby, the frequency of high level application to the gate (CG) of a cell transistor CT is low, and disturbance of the memory cell MC may be reduced. The selection gate line SG0 is set to the high level (4 V). Thereby, in comparison with the case where the selection gate line SG0 is set to the power supply voltage (1.8 V), efficiency of program based on hot electrons of the memory cell MC is improved.

Figure 8:
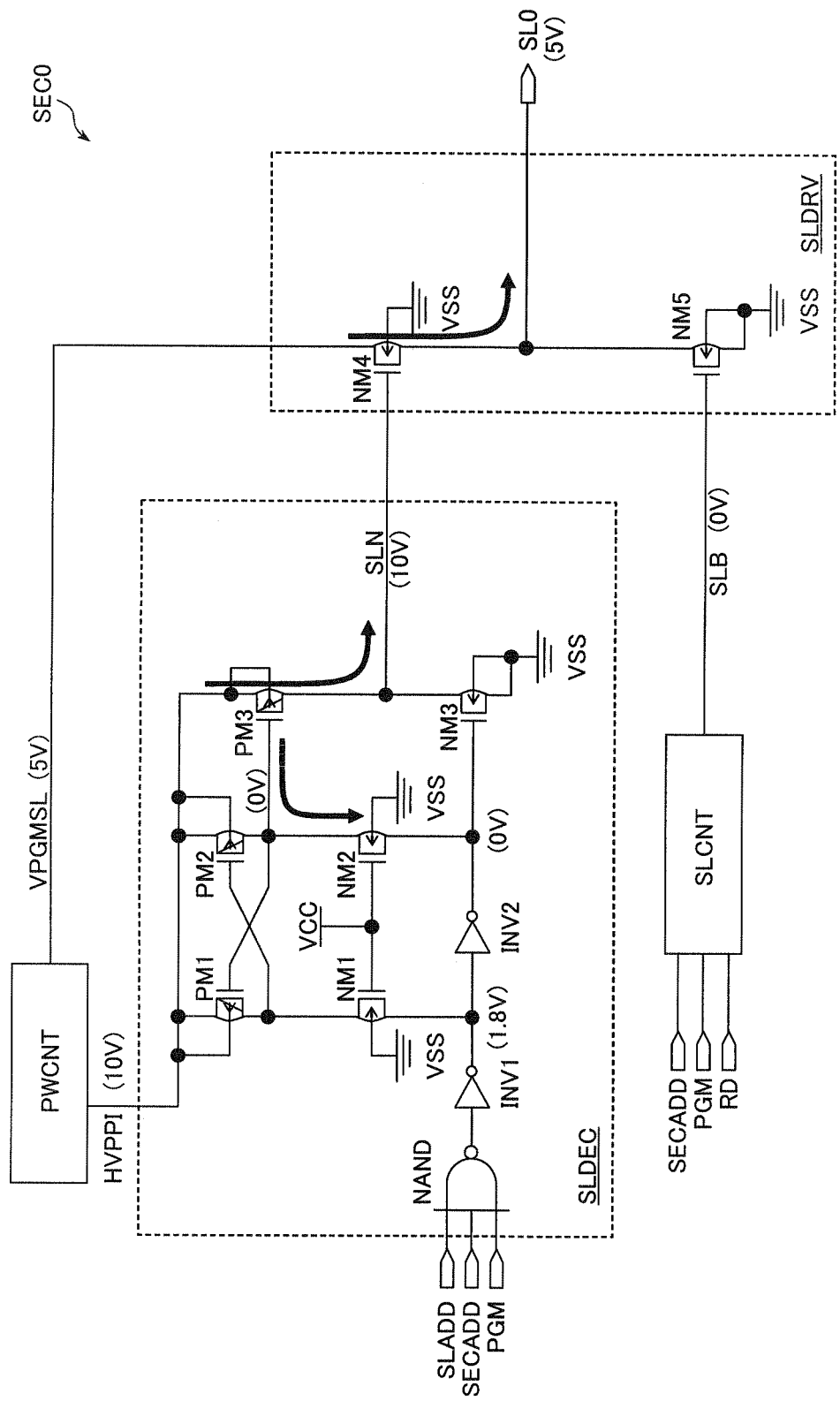
FIG. 8 illustrates an operation example of the source line decoder and source line driver which are coupled to a selected source line in a selected sector in a program operation.

FIG. 8 illustrates an operation example, in the program operation, of the source line decoder SLDEC and source line driver SLDRV which are coupled to the selected source line SL0 in the selected sector SEC0. A thick arrow illustrates that the current flows through the signal lines and transistors.

As mentioned above, the source line decoder SLDEC sets the output of the inverter INV1 to the high level (1.8 V) and sets the output of the inverter INV2 to the low level (0 V). Thereby, the transistors PM1 and PM3 are turned-on, and the source control signal SLN is set to the high level (10 V). The transistors NM1 and NM2 are always "ON". Receiving the source control signal SLN of the high level, the source line driver SLDRV turns-on the transistor NM4, and sets the source line SL0 to 5 V.

Figure 9:
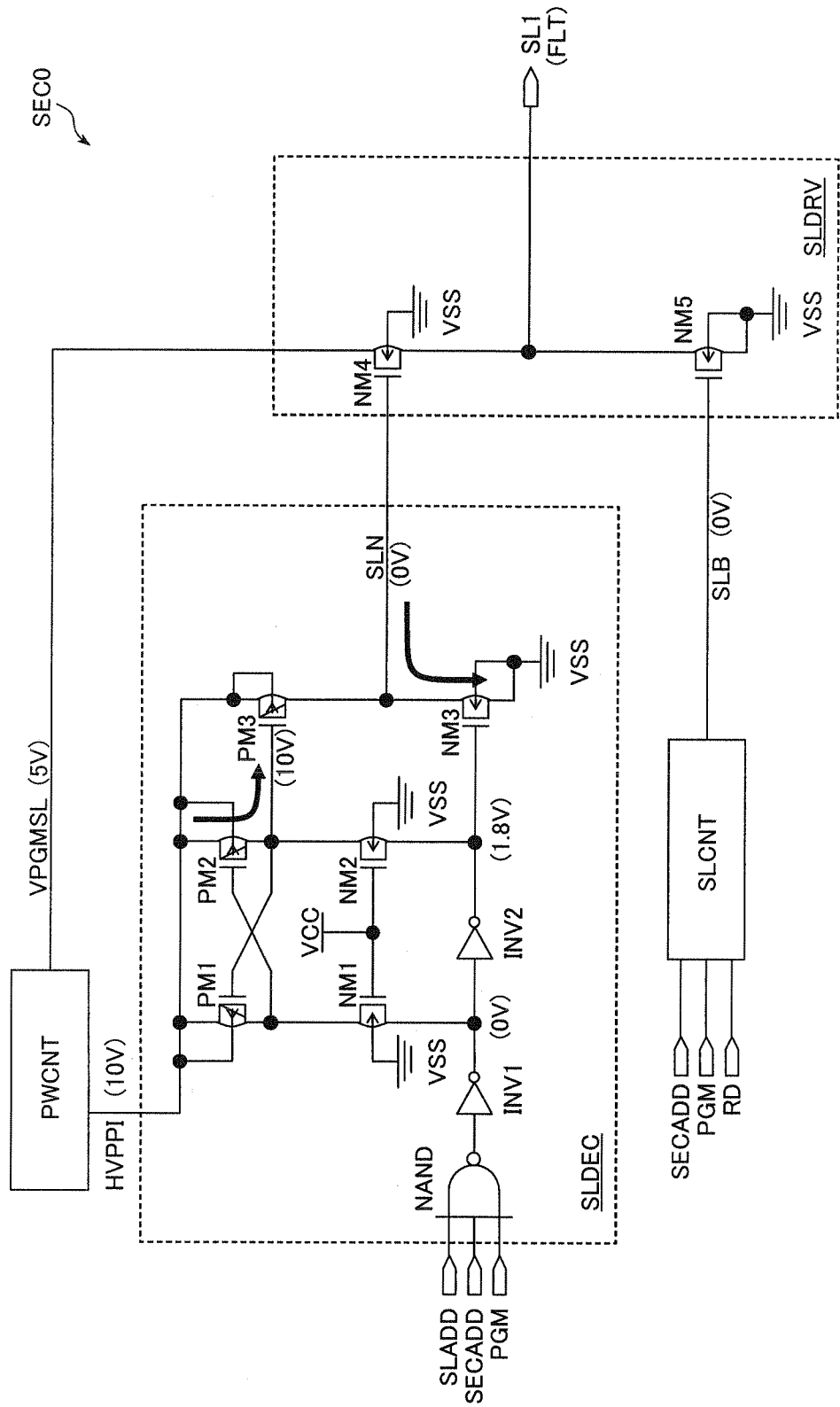
FIG. 9 illustrates an operation example of the source line decoder and source line driver which are coupled to an unselection source line in the selected sector in the program operation.

FIG. 9 illustrates an operation example of the source line decoder SLDEC and source line driver SLDRV which are coupled to the unselection source line SL1 in the selected sector SEC0 in the program operation. A thick arrow illustrates that the current flows through the signal lines and transistors.

As mentioned above, the source line decoder SLDEC sets the output of the inverter INV1 to the low level (0 V) and sets the output of the inverter INV2 to the high level (1.8 V). Thereby, the transistors PM2 and NM3 are turned-on, and the source control signal SLN is set to the low level (0 V). The transistors NM1 and NM2 are always "ON". Receiving the source control signals SLN and SLB of the low level, the source line driver SLDRV turns-off the transistors NM4 and NM5, and sets the source line SL1 to the floating state. Other source line decoders SLDEC and source line drivers SLDRV corresponding to the source lines SL2-7 of the sector SEC0 also operate similarly.

Figure 10:
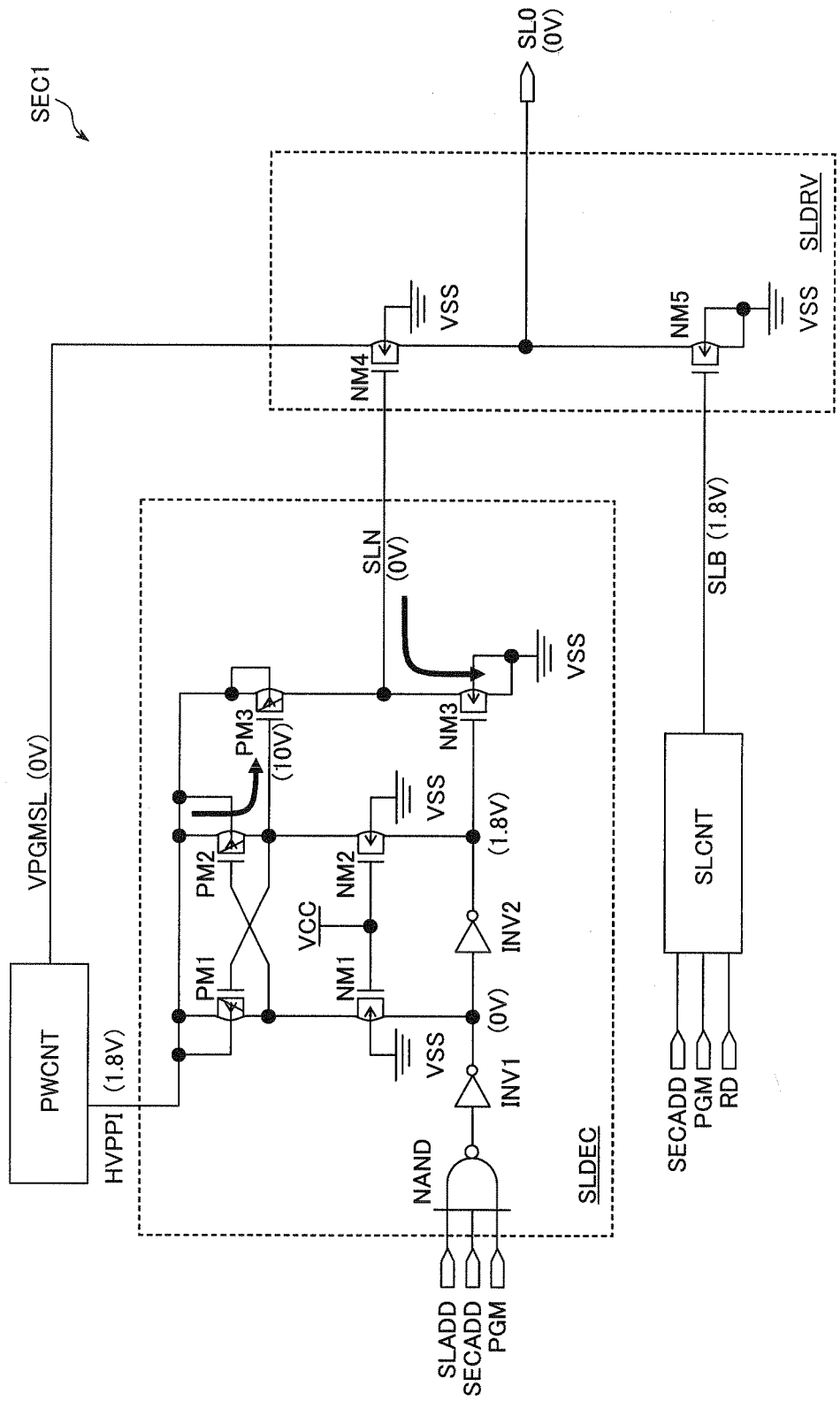
FIG. 10 illustrates an operation example of the source line decoder and source line driver which are coupled to a source line in an unselection sector in the program operation.

FIG. 10 illustrates an operation example of the source line decoder SLDEC and source line driver SLDRV which are coupled to the source line SL0 in the unselection sector SEC1 in the program operation. A thick arrow illustrates that the current flows through the signal lines and transistors. Operation of the source line decoder SLDEC is the same as that in FIG. 9.

Receiving the source control signal SLB of the high level (1.8 V), the source line driver SLDRV turns-on the transistor NM5, and sets the source line SL0 to 0 V. Other source line decoders SLDEC and source line drivers SLDRV which correspond to the sector SEC1 also operate similarly.

Figure 11:
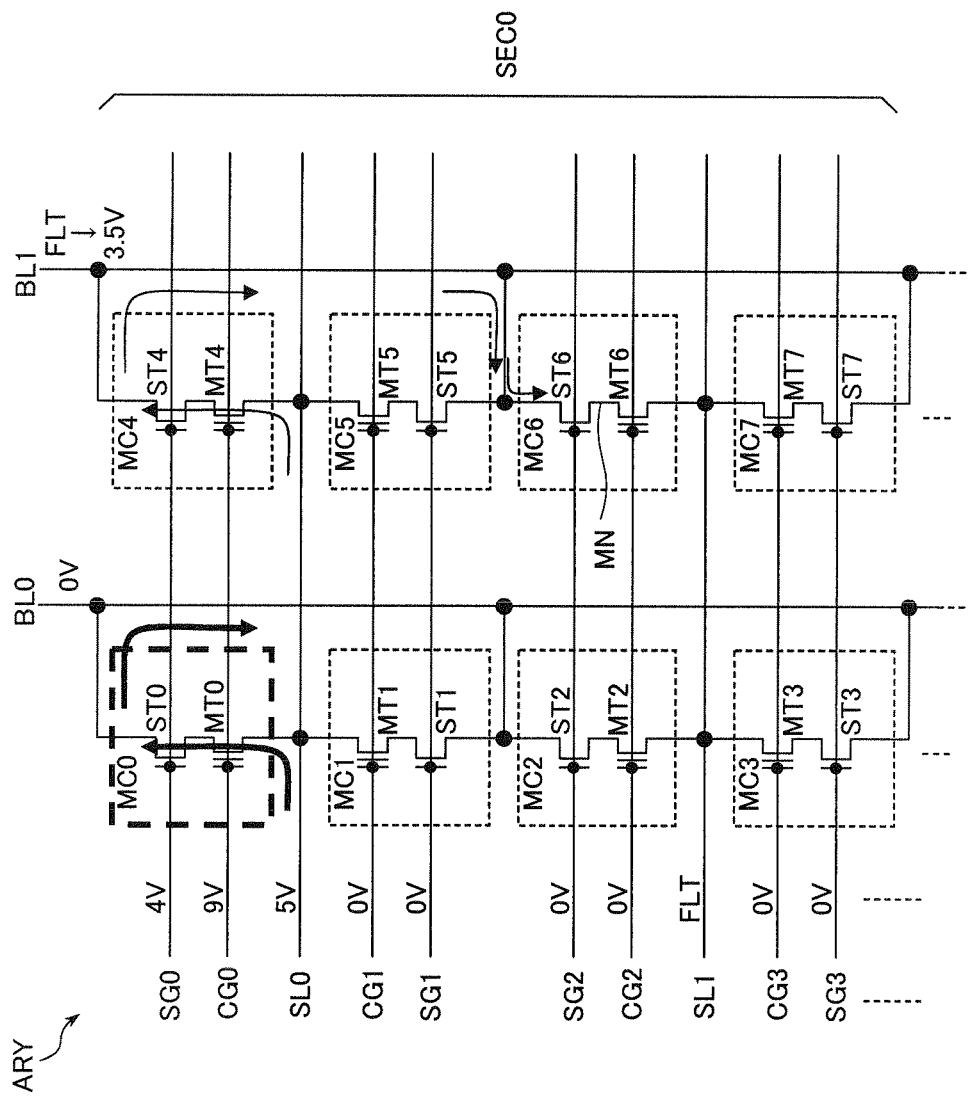
FIG. 11 illustrates an operation example in the memory cell array in the program operation of the semiconductor memory illustrated in FIG. 2.

FIG. 11 illustrates an operation example in the program operation in the memory cell array ARY of the semiconductor memory MEM illustrated in FIG. 2. An arrow in the figure illustrates the current flowing through the signal lines and transistors. A thick arrow illustrates that the current is large. For making description easy to understand, in FIG. 11, the memory cell MC, memory transistor MT, and selection transistor ST are each numbered. In this example, the memory cell MC0, illustrated with a thick broken line, coupled to the control gate line CG0, selection gate line SG0, and bit line BL0 in the sector SEC0, is set to logic "0". For example, all the memory cells MC0-7 are set to logic "1" before the program operation.

When the program operation starts, the selection gate line SG0 is set to the high level (4 V), and the control gate line CG0 is set to the high level (9 V). The source line SL0 is set to the high level (5 V), and the bit line BL0 is set to the low level (0 V). Other selection gate lines SG1-3 and control gate lines CG1-3 in the sector SEC0 are set to the low level (0 V). Other source line SL1 and bit line BL1 in the sector SEC0 are set to the floating state FLT.

The control gate line CG0 of the high level and the selection gate line SG0 of the high level cause a current to flow into the bit line BL0 from the source line SL0 via the memory transistor MT0 and selection transistor ST0 in the memory cell MC0. The high level of the control gate line CG0 causes a part of electrons flowing between the source and drain of the memory transistor MT0 to be injected into the floating gate as hot electrons. Thereby, the threshold voltage of the memory transistor MT0 becomes high, and the memory cell MC0 is set to logic "0".

Since the bit line BL1 is set to the floating state FLT, a current flows into the bit line BL1 from the source line SL0 via the memory cell MC4 until the bit line BL1 is charged up. When the threshold voltage of the selection transistor ST4 is 0.5 V, the voltage of the bit line BL1 rises up to nearly 3.5 V, for example. That is, the bit line BL1 is charged until the gate-to-source voltage of the selection transistor ST4 becomes 0.5 V or less. The source of the selection transistor ST4, here, couples the bit line BL1.

For example, in the memory cell MC6 coupled to the source line SL1 in the floating state FLT, data are erased. The threshold voltage of the memory transistor MT6 is set to negative (depression state), and even if the control gate line CG2 is at the low level (0 V), the channel resistance of the memory transistor MT6 is low. Therefore, the voltage of the source line SL1 changes depending on the voltage of the middle node MN between the selection transistor ST6 and the memory transistor MT6. That is, charges accumulated in the middle node flows into the source line SL1 via the memory transistor MT6.

The gate of the selection transistor ST6 of the memory cell MC6 coupled to the source line SL1 in the floating state FLT receives 0 V of the selection gate line SG2. The threshold voltage of the selection transistor ST6 is designed to be low (for example, 0.5 V) for a high speed operation, and a subthreshold leakage current is generated according to the source-to-drain voltage difference. Therefore, the source line SL1 and the middle node MN of the memory cell MC6 have charges accumulated due to the leak current (subthreshold leakage current) from the bit line BL1 (3.5 V) via the selection transistor ST6. At this time, the drain of the selection transistor ST6 couples the bit line BL1, and the source of the selection transistor ST6 couples the middle node MN.

When the voltages of the source line SL1 and middle node MN rise due to the charge accumulation to the source line SL1 and middle node MN, the gate-to-source voltage of the selection transistor ST6 becomes small. Thereby, the selection transistor ST6 is cut off, and thus the subthreshold leakage current may be reduced automatically.

Blocking-off the leak path from the bit line BL1 to the source line SL1 may prevent the high level of the source line SL0 from becoming low during the program operation. Consequently, this may prevent the source-to-drain current of the memory transistor MT0 from decreasing, and may enable the program operation to be executed efficiently. That is, this may prevent the data program operation time from becoming long.

In particular, this may reduce a leak current which flows into the bit line BL1 from the source line SL0 via the selection transistor ST4 having no relation to the program operation, and therefore the high level voltage of the selection gate line SG0 coupled to the selection transistor ST4 may be increased (for example, 4 V). Consequently, the data program operation time may be shortened further.

Furthermore, this may prevent the constant leak current from flowing through the memory cell MC4, MC6 or the like coupled to the bit line BL1, a so-called disturbance phenomenon where the threshold voltage of the memory transistor MT4, MT6 or the like gradually becomes high may be prevented. Consequently, this may enable data retention characteristic of logical "1" to be improved and reliability of the semiconductor memory MEM to be improved.

Figure 12:
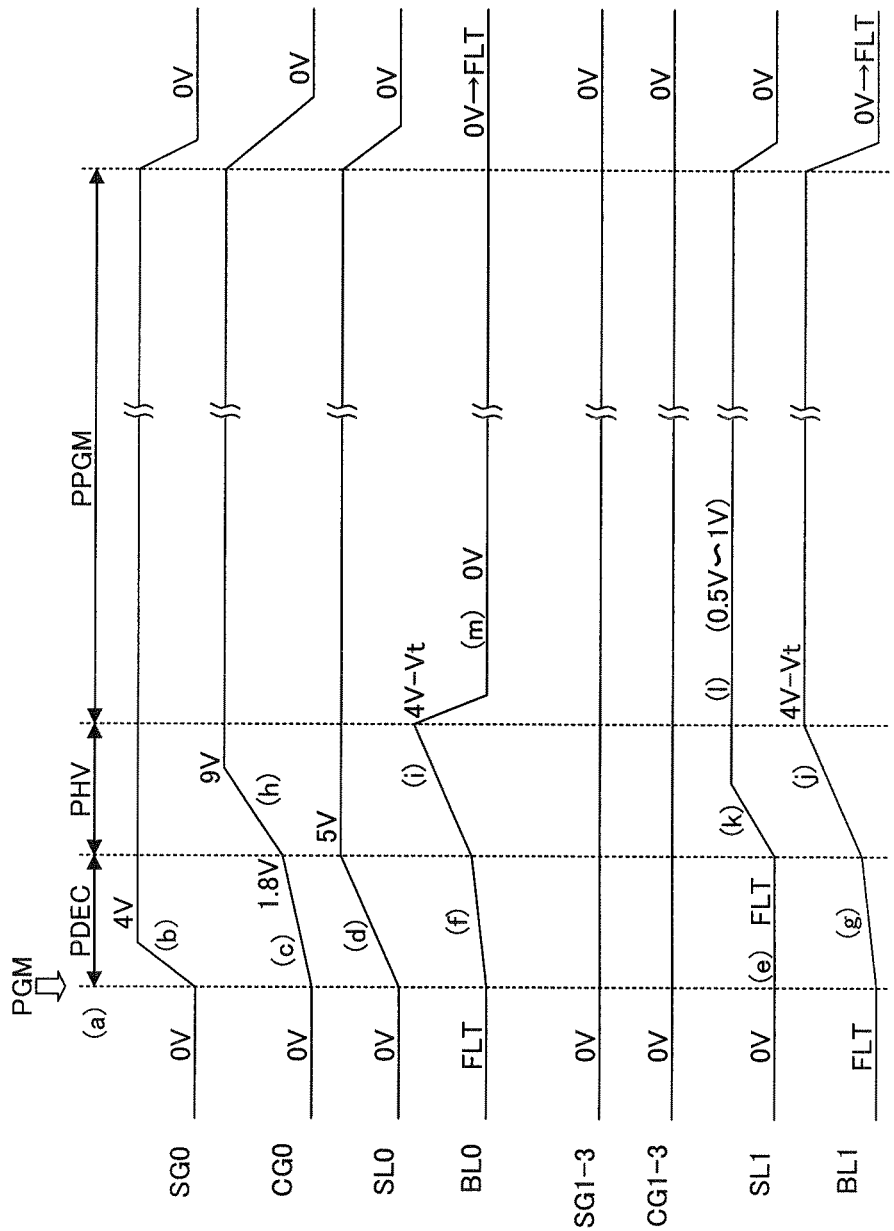
FIG. 12 illustrates an example of the program operation of the semiconductor memory illustrated in FIG. 2.

FIG. 12 illustrates an example of the program operation of the semiconductor memory MEM illustrated in FIG. 2. In this example, similarly as FIG. 11, the memory cell MC0 of the sector SEC0 has logic "0" programmed. FIG. 12 illustrates waveforms in the signal lines of the sector SEC0 illustrated in FIG. 11.

In an initial state (standby state) before the program operation, first, the selection gate lines SG0-3, control gate lines CG0-3, and source lines SL0-1 are set to 0 V, and the bit lines BL0-1 are set to the floating state FLT. The operation control unit 12 starts the program operation of the memory core 16 in response to the program command PGM (FIG. 12 (a)).

In a decoding period PDEC, the selection gate line driver SGDRV illustrated in FIG. 3 drives the selection gate line SG0 according to the row address signal RA and sets it to 4 V (FIG. 12 (b)). The control gate line CG0 is temporarily set to 1.8 V based on decoding operation of the selection gate line SG0 by the selection gate line driver SGDRV (FIG. 12 (c)). The source line SL0 of the sector SEC0 is set to 5 V (FIG. 12 (d)). Other source line SL1 of the sector SEC0 are set to the floating state FLT (FIG. 12 (e)).

The voltage of the bit line BL0 in the floating state FLT rises due to the current flowing from the source line SL0 via the memory transistor MT0 and selection transistor ST0 (FIG. 12 (f)). Similarly, the voltage of the bit line BL1 in the floating state FLT rises due to the current flowing from the source line SL0 via the memory transistor MT4 and selection transistor ST4 (FIG. 12 (g)).

Subsequently, in the supply start period PHV of the high voltage, the control gate line driver CGDRV starts operation, and the voltage of the control gate line CG0 rises to 9 V (FIG. 12 (h)). Thereby, the voltage of the bit line BL0 rises to a voltage obtained by subtracting the threshold voltage Vt of the selection transistor ST0 from the voltage (4 V) of the selection gate line SG0 (FIG. 12(i)). Similarly, the voltage of the bit line BL1 rises to a voltage obtained by subtracting the threshold voltage Vt of the selection transistor ST4 from the voltage (4 V) of the selection gate line SG0 (FIG. 12 (j)). With the voltage rise of the bit line BL1, the subthreshold leakage current flows through the selection transistor ST6 and memory transistor MT6, and the voltage of the source line SL1 rises (FIG. 12 (k)). If the selection transistor ST6 is cut off due to the voltage rise of the source line SL1, the subthreshold leakage current may not flow. Thereby, the voltage rise of the source line SL1 stops. For example, the voltage of the source line SL1 is held between 0.5 V and 1 V (FIG. 12 (l)). That is, the source line control unit SLCNT controls the voltage of the source line SL1 to be set to a value higher than the voltage (for example, 0 V) of the unselection selection gate lines SG1-3, and to a value lower than the voltage (4 V-Vt; for example, 3.5 V) of the unselection bit line BL1.

Then, in a program period PPGM, the bit line BL0 is set to 0 V (FIG. 12 (m)). Thereby, a program current flows between the source and drain of the memory transistor MT0, and the memory cell MC0 is set to logic "0". The program period PPGM is sufficiently long in comparison with the decoding period PDEC and high voltage supply start period PHV, and occupies most of the program operation time. In the program period PPGM, as described in FIG. 11, a leak path dissipating constantly charges of the bit line BL1 does not exist. This may prevent the high level of the source line SL0 from becoming low during the program operation, and may enable the program operation to be executed efficiently. Then, after the program period PPGM, the voltage of each signal line returns to the initial state, and the program operation is completed.

Figure 13:
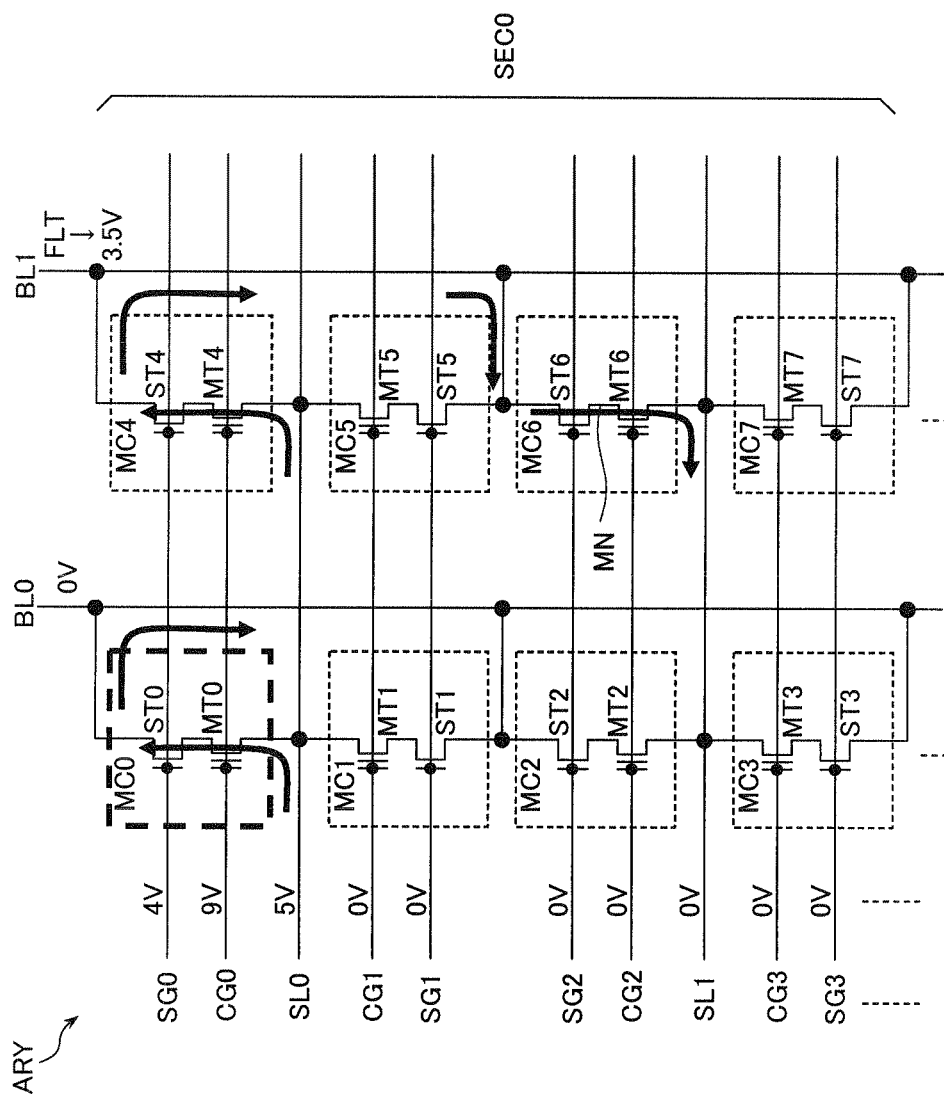
FIG. 13 illustrates an operation example in the memory cell array at the time when the unselection source line in the selected sector is set to 0 V in the program operation.

FIG. 13 illustrates an operation example in the memory cell array ARY at the time when the unselection source line SL1 in the selected sector SEC0 is set to 0 V in the program operation. With respect to the same components and the same operations as those in FIG. 11, detailed descriptions are omitted.

In this example, the unselection source line SL1 is set to 0 V at the time of the program operation. The threshold voltage of the memory transistor MT6 is set as negative. Therefore, the voltage of the middle node MN is set to 0 V which is the same as the voltage of the source line SL1. The voltage of the bit line BL1 which is the drain of the selection transistor ST6 rises up to 3.5 V. Therefore, the subthreshold leakage current flows constantly between the source and drain of the selection transistor ST6 and between the source and drain of the memory transistor MT6. Consequently, the constant leak current from the source line SL0 to the source line SL1 is generated, and the voltage of the source line SL0 drops, which makes it difficult to maintain the voltage (5 V) required for the program operation.

In order to make the constant leak current small, it is necessary to drop the high level voltage of the selection gate line SG0 until the leak current of the selection transistor ST6 disappears. However, dropping the high level voltage of the selection gate line SG0 causes the current flowing between the source and drain of the memory transistor MT0 where data are to be programmed to decrease. Consequently, the hot electrons decreases, and the program operation time becomes long. The present embodiment may solve this problem.

As mentioned above, in the present embodiment, in the semiconductor memory MEM where the selection gate line SG0 coupled to the memory cell MC0 where data are to be programmed is set to the voltage (for example, 4 V) higher than the power supply voltage VCC, the leak current flowing from the source line SL0 to the source line SL1 may be reduced, and the program operation time may be shortened. Setting the unselection source line SL1 to the floating state FLT at the time of program operation makes a transistor for voltage-switchover at the time of unselection unnecessary. As a result, a circuit size of the source line decoder SLDEC and source line driver SLDRV may be made small. Because the source line decoder SLDEC and source line driver SLDRV are required for every source line SL, the effect of the chip size reduction is large.

Figure 14:
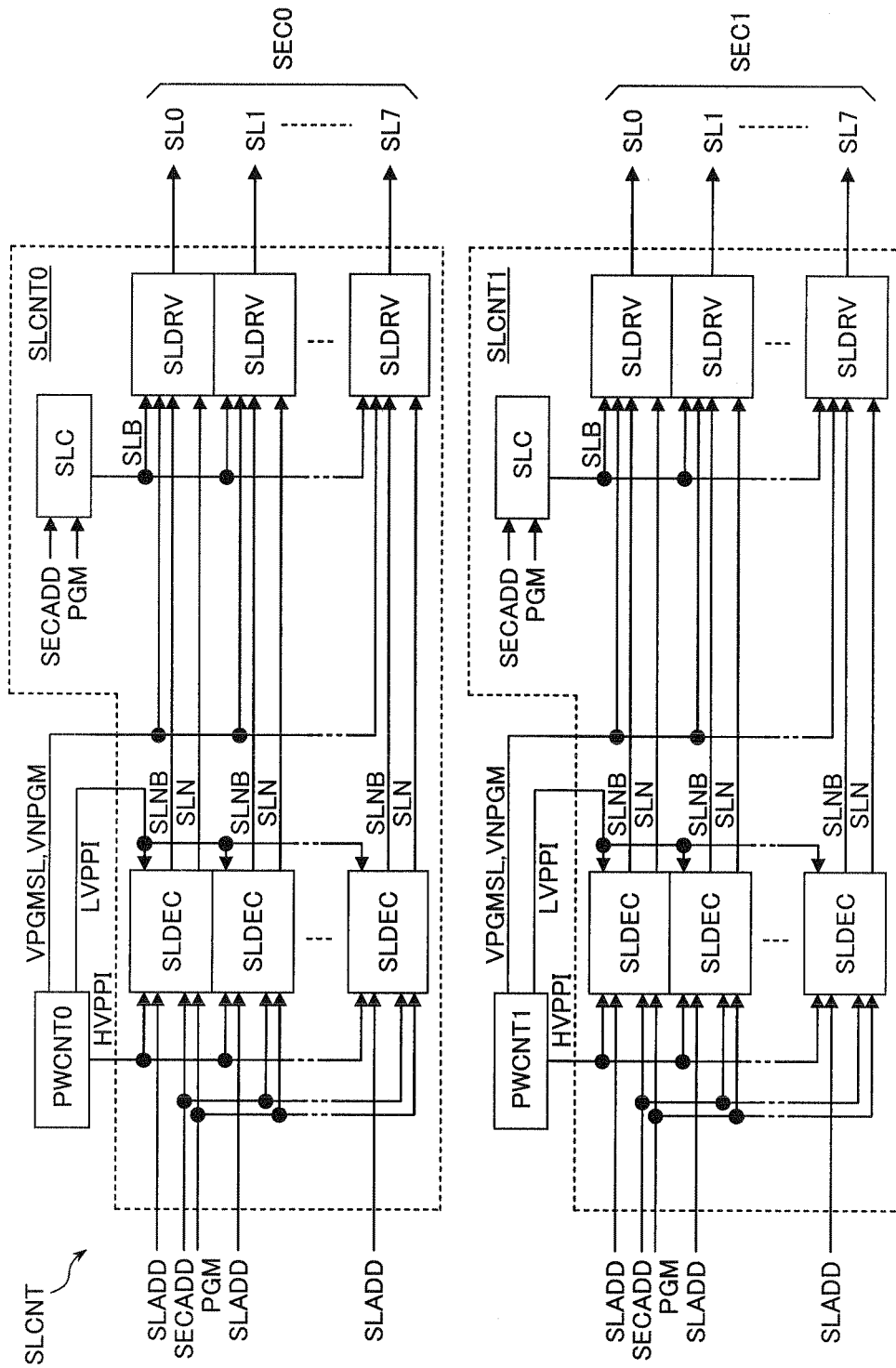
FIG. 14 illustrates an example of a power control unit and a source line control unit in another embodiment.

FIG. 14 illustrates an example of the power control unit PWCNT and source line control unit SLCNT in another embodiment. With respect to the same components as the components described in the embodiment mentioned above, the same reference characters are given, and detailed descriptions thereof are omitted. The present embodiment is similar as the embodiment mentioned above except for the difference in the power control unit PWCNT and source line control unit SLCNT. That is, the semiconductor memory MEM including the power control unit PWCNT and source line control unit SLCNT is a NOR type flash memory, for example. The semiconductor memory MEM is similar as that of FIG. 2 except for the difference in the power control unit PWCNT and source line control unit SLCNT in the memory core 16. The semiconductor memory MEM may operate in synchronization with the clock signal, and may operate in asynchroniztion with the clock signal.

The power control unit PWCNT has a function of generating the high level voltage LVPPI and an unselection source voltage VNPGM added to the power control unit PWCNT illustrated in FIG. 4. For example, the high level voltage LVPPI is set to either 9 V or 0 V, and the unselection source voltage VNPGM is set to 1.8 V (VCC) or to the floating state FLT.

Each of the source line decoders SLDEC in the source line control unit SLCNT, receiving the high level voltages HVPPI, LVPPI, source line address SLADD, sector address SEC-ADD, and program control signal PGM, outputs source control signals SLNB and SLN. Receiving the source control signals SLNB, SLN, and SLB, the program source voltage VPGMSL, and the unselection source voltage VNPGM, each of the source line drivers SLDRV in the source line control unit SLCNT sets the corresponding source line SL to a predetermined voltage.

Figure 15:
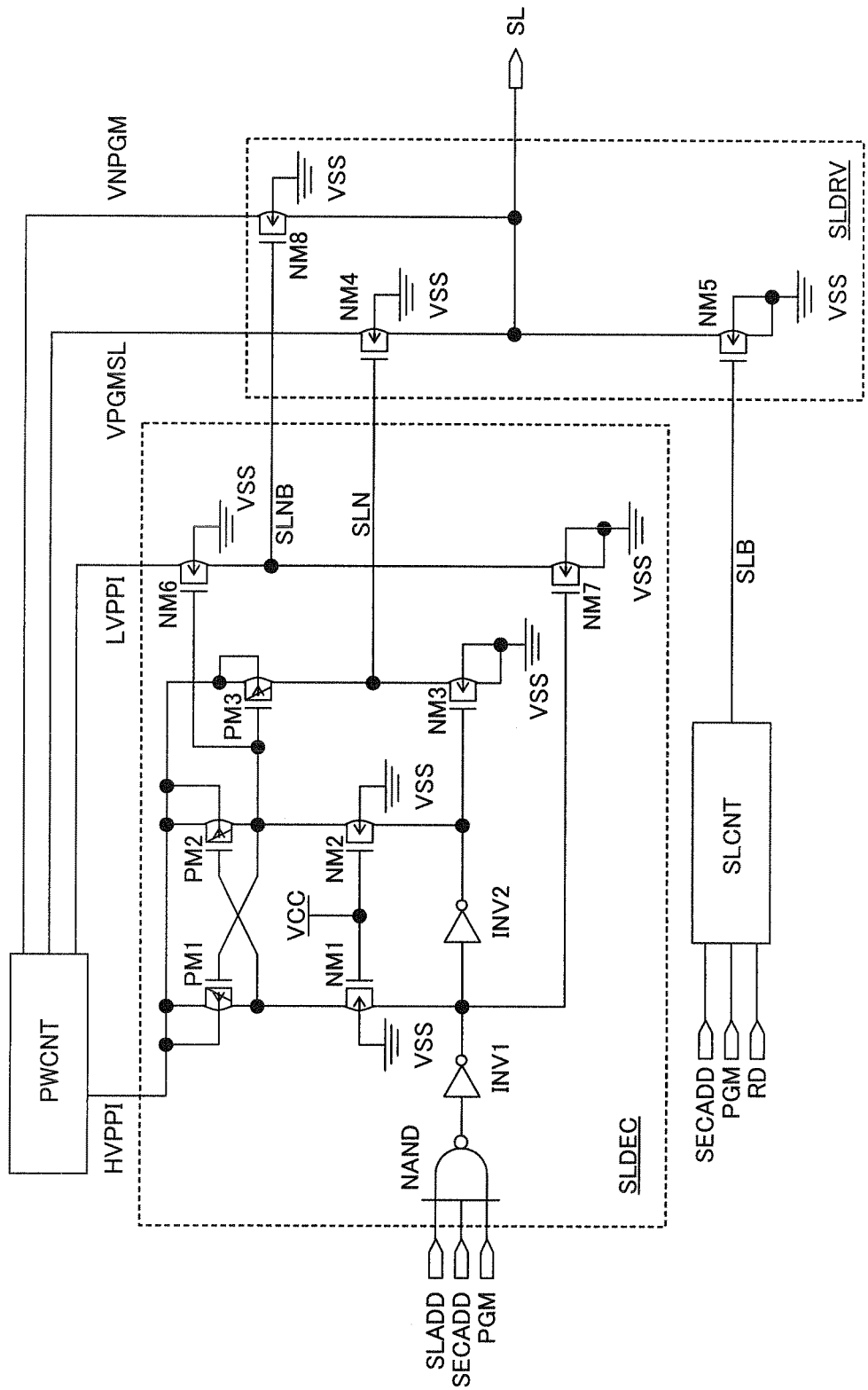
FIG. 15 illustrates an example of a source line decoder and a source line driver which are illustrated in FIG. 14.

FIG. 15 illustrates an example of the source line decoder SLDEC and source line driver SLDRV illustrated in FIG. 14. With respect to the same components as FIG. 5, detailed descriptions are omitted.

The source line decoder SLDEC has nMOS transistors NM6 and NM7 added to the source line decoder SLDEC illustrated in FIG. 5. The transistor NM6 has the drain coupled to the high level voltage line LVPPI, gate coupled to the gate of the transistor PM3, and source coupled to the source control signal line SLNB. The transistor NM7 has the drain coupled to the source control signal line SLNB, gate coupled to the output of the inverter INV1, and source coupled to the ground line VSS. The back gates of the transistors NM6-7 are coupled to the ground line VSS.

In the program operation, the source line decoder SLDEC corresponding to the unselection source line SL in the selected sector SEC0 turns-on the transistors PM2, NM3, and NM6, and turns-off the transistors PM1, PM3, and NM7. The transistors NM1 and NM2 are always "ON". Thereby, the source control signals SLN and SLNB are set to the low level (0 V) and the high level (for example, 8 V), respectively.

The source line driver SLDRV has an nMOS transistor NM8 added to the source line driver SLDRV illustrated in FIG. 5. The transistor NM8 has the drain coupled to the unselection source voltage VNPGM, gate coupled to the source control signal line SLNB, and source coupled to the corresponding source line SL. In the program operation, the source line driver SLDRV corresponding to the unselection source line SL in the selected sector SEC0 turns-off the transistors NM4-5, and turns-on the transistor NM8. Thereby, the unselection source line SL is set to the high level (for example, 1.8 V).

FIG. 16 illustrates an example of voltages of the signal lines at the time when the semiconductor memory MEM having the source line control unit SLCNT illustrated in FIG. 14 operates. With respect to the signal lines of the same voltages as FIG. 7, detailed descriptions are omitted. The voltages in the read operation RD and erasure operation ERS are the same as FIG. 7. In the program operation PGM, the unselection source line SL in the selected sector SEC is set to 1.8 V (VCC). Other voltages of the program operation PGM are the same as FIG. 7.

Figure 17:
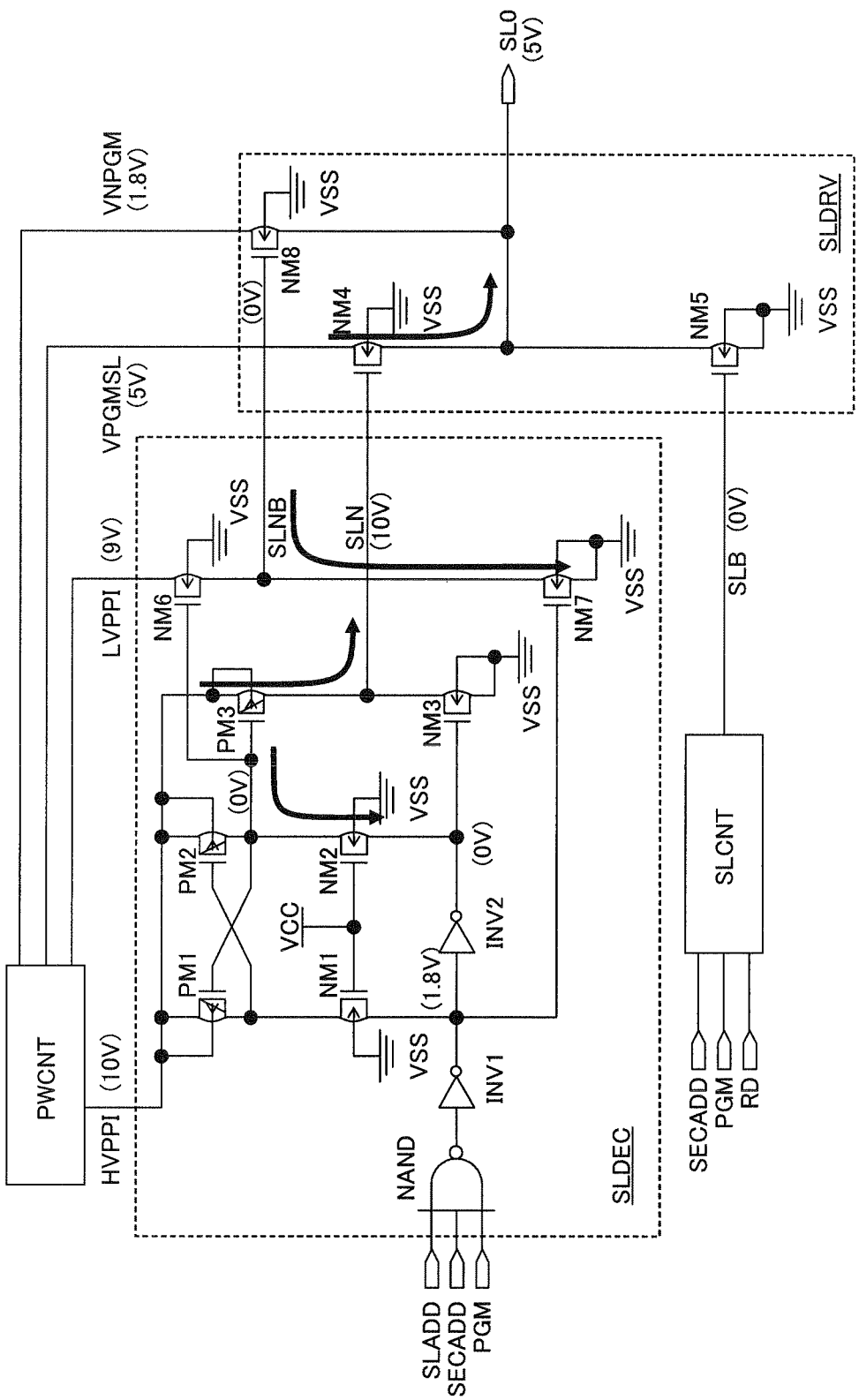
FIG. 17 illustrates an operation example of the source line decoder and source line driver which are coupled to the selected source line in the selected sector, in the program operation of the semiconductor memory having the power control unit and source line control unit which are illustrated in FIG. 14.

FIG. 17 illustrates the program operation of the semiconductor memory MEM having the power control unit PWCNT and source line control unit SLCNT which are illustrated in FIG. 14. Specifically, FIG. 17 illustrates an operation example of the source line decoder SLDEC and source line driver SLDRV which are coupled to the selected source line SL0 in the selected sector SEC0. With respect to the same operations as FIG. 8, detailed descriptions are omitted.

In the program operation, the high level voltages HVPPI and LVPPI of the selected sector SEC0 are set to 10 V and 9 V, respectively, and the program source voltage VPGMSL and unselection source voltage VNPGM in the selected sector SEC0 are set to 5 V and 1.8 V, respectively. When the source line SL0 is selected, outputs of the inverters INV1 and INV2 are set to the high level (1.8 V) and the low level (0 V), respectively. Thereby, the transistors PM1, PM3, and NM7 are turned on, and the transistors PM2, NM3, and NM6 are turned off, and the source control signals SLN and SLNB are set to the high level (10 V) and the low level (0 V), respectively. The transistors NM1 and NM2 are always "ON".

Receiving the source control signal SLN of the high level, the source line driver SLDRV turns-on the transistor NM4, and receiving the source control signal SLNB of the low level, the source line driver SLDRV turns-off the transistor NM8. The transistor NM5 has been turned off. Therefore, the source line SL0 is set to 5 V similarly as FIG. 8.

Figure 18:
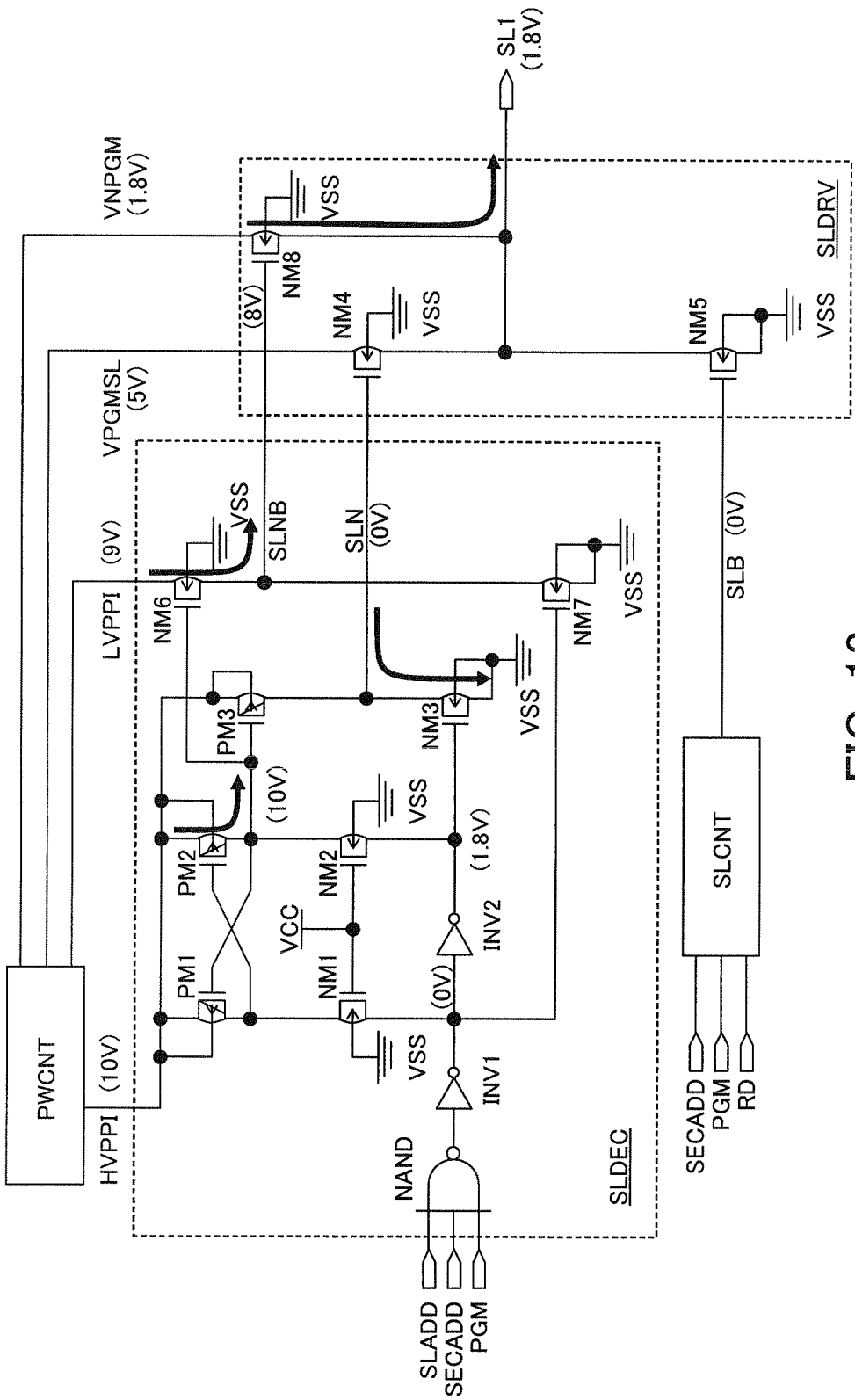
FIG. 18 illustrates an operation example of the source line decoder and source line driver which are coupled to the unselection source line in the selected sector, in the program operation of the semiconductor memory having the power control unit and source line control unit which are illustrated in FIG. 14.

FIG. 18 illustrates the program operation of the semiconductor memory MEM having the power control unit PWCNT and source line control unit SLCNT which are illustrated in FIG. 14. Specifically, FIG. 18 illustrates an operation example of the source line decoder SLDEC and source line driver SLDRV which are coupled to the unselection source line SL1 in the selected sector SEC0. With respect to the same operations as FIG. 9, detailed descriptions are omitted.

When the source line SL1 is not selected, outputs of the inverters INV1 and INV2 are set to the low level (0 V) and the high level (1.8 V), respectively. Thereby, the transistors PM2, NM3, and NM6 are turned on, and the transistors PM1, PM3, and NM7 are turned off. The transistors NM1 and NM2 are always "ON". The source control signals SLN and SLNB are set to the low level (0 V) and the high level (for example, 8 V), respectively.

Receiving the source control signal SLN of the low level, the source line driver SLDRV turns-off the transistor NM4, and receiving the source control signal SLNB of the high level, the source line driver SLDRV turns-on the transistor NM8. The transistor NM5 has been turned off. Since the gate of the transistor NM8 receives the source control signal SLNB of 8 V, the source line SL1 is set to 1.8 V (VCC) which is the same as the program source voltage VNPGM.

Figure 19:
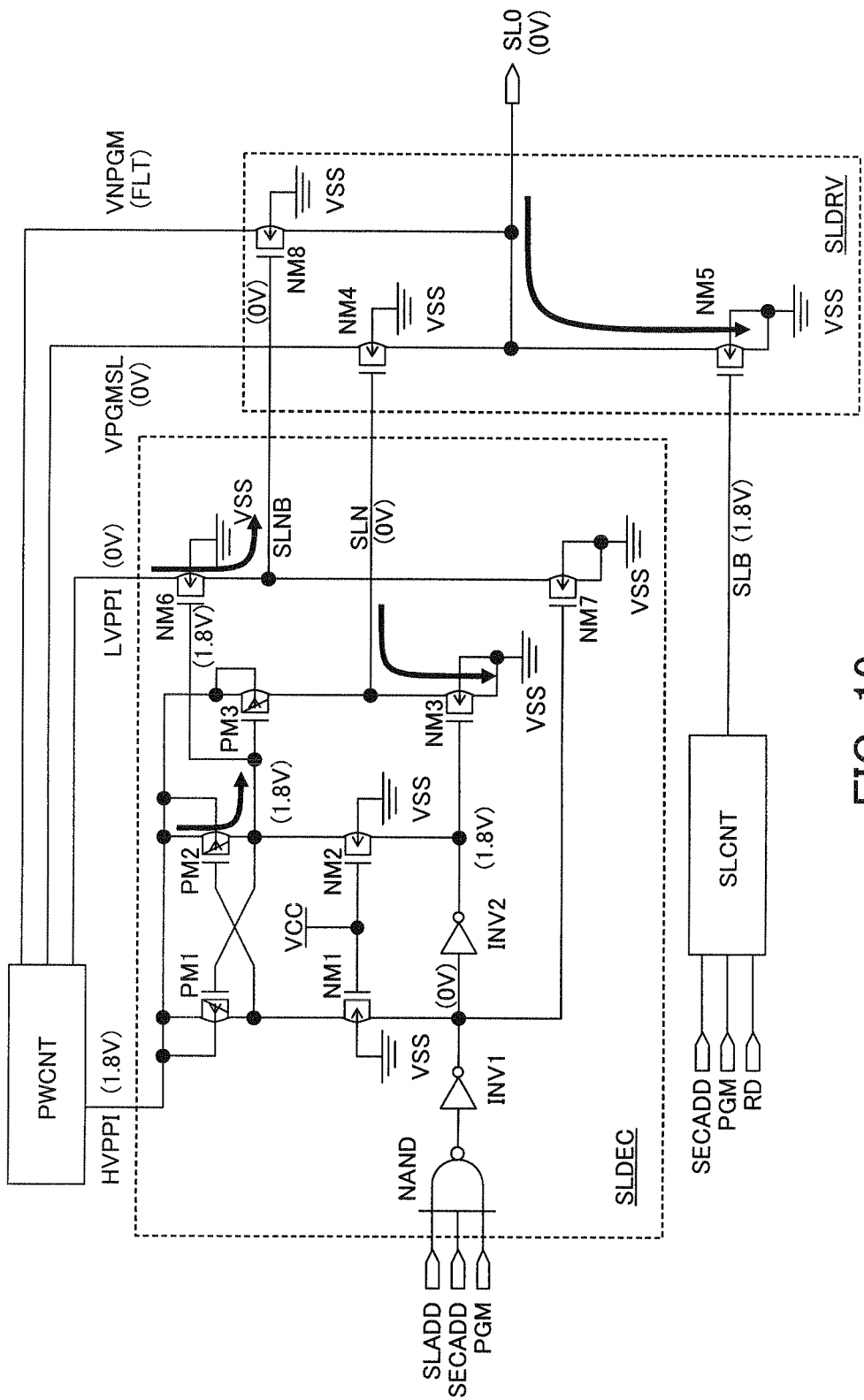
FIG. 19 illustrates an operation example of the source line decoder and source line driver which are coupled to the source line in the unselection sector, in the program operation of the semiconductor memory having the power control unit and source line control unit which are illustrated in FIG. 14.

FIG. 19 illustrates the program operation of the semiconductor memory MEM having the power control unit PWCNT and source line control unit SLCNT which are illustrated in FIG. 14. Specifically, FIG. 19 illustrates an operation example of the source line decoder SLDEC and source line driver SLDRV which are coupled to the source line SL0 in the unselection sector SEC1. With respect to the same operations as FIG. 10, detailed descriptions are omitted.

In the unselection sector SEC, outputs of the inverters INV1 and INV2 are set to the low level (0 V) and the high level (1.8 V), respectively. Thereby, the transistors PM1-3, NM1-3, and NM6-7 are turned on or turned off similarly as FIG. 18. However, in the unselection sector SEC, the high level voltages HVPPI and LVPPI are set to 1.8 V (VCC) and 0 V (VSS), respectively. Therefore, the source control signals SLN and SLNB are both set to the low level (0 V).

Receiving the source control signals SLN and SLNB of the low level, the source line driver SLDRV turns-off the transistors NM4, NM8. In the unselection sector SEC, the program source voltage VPGMSL and the unselection source voltage VNPGM are set to 0 V and the floating state FLT, respectively. In the unselection sector SEC, the transistor NM5 is turned on receiving the source control signal SLB of the high level (1.8 V; VCC). Therefore, the source line SL0 is set to 0 V.

Figure 20:
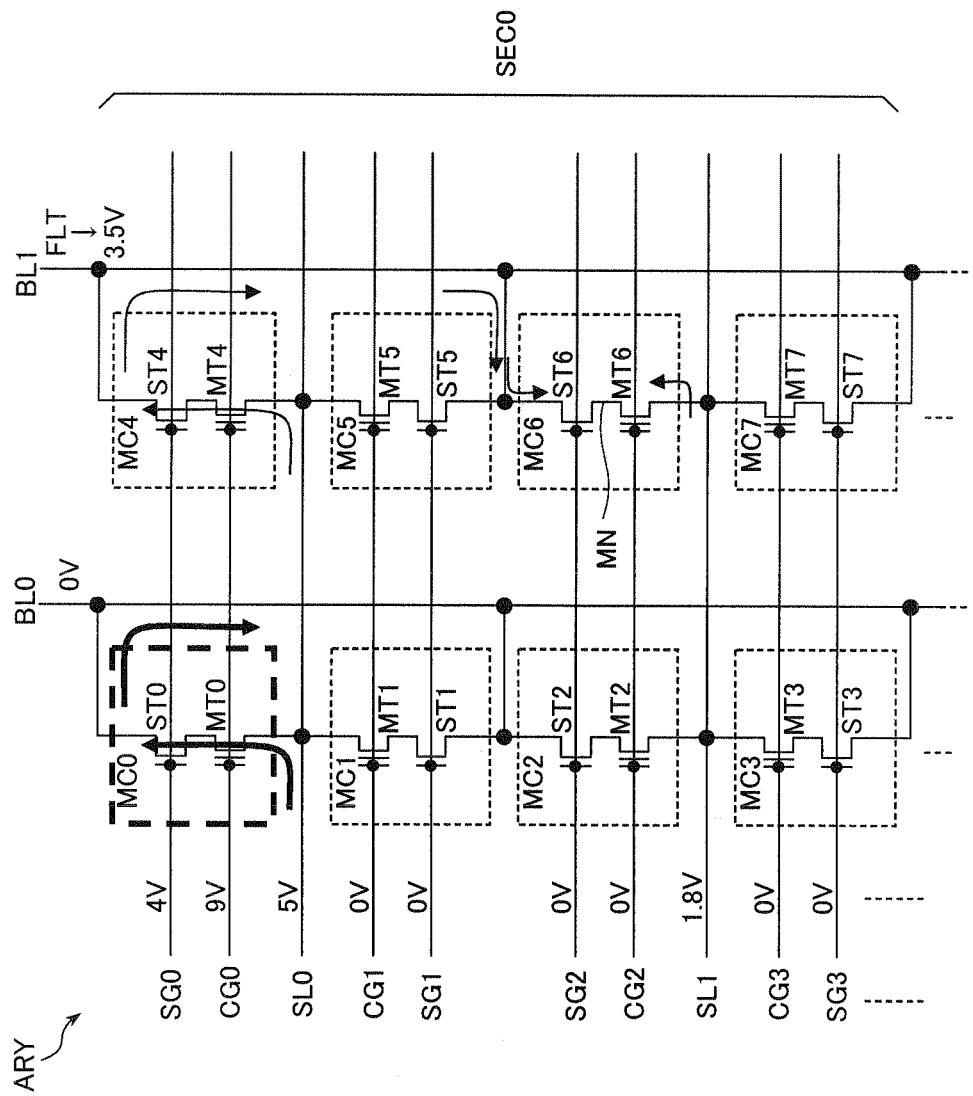
FIG. 20 illustrates an operation example of the memory cell array in the program operation of the semiconductor memory having the power control unit and source line control unit which are illustrated in FIG. 14.

FIG. 20 illustrates an operation example of the memory cell array ARY in the program operation of the semiconductor memory MEM having the power control unit PWCNT and source line control unit SLCNT which are illustrated in FIG. 14. FIG. 20 is similar as FIG. 11 except that the unselection source line SL1 in the selection sector SEC0 is set to the high level (1.8 V; VCC).

Figure 21:
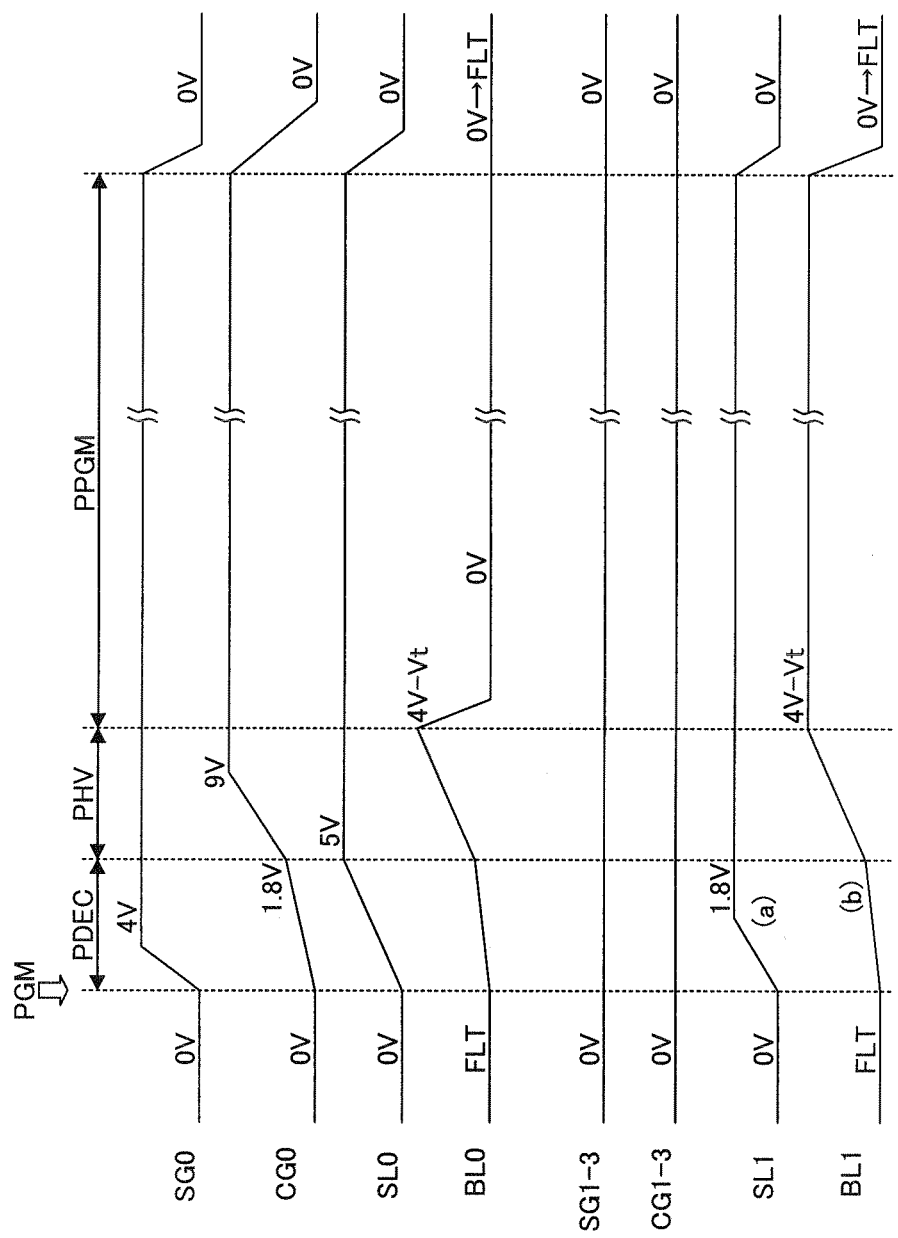
FIG. 21 illustrates an example of the program operation of the semiconductor memory having the power control unit and source line control unit which are illustrated in FIG. 14.

FIG. 21 illustrates an example of an program operation of the semiconductor memory MEM having the power control unit PWCNT and source line control unit SLCNT which are illustrated in FIG. 14. In this example, the memory cell MC0 of the sector SEC0 illustrated in FIG. 20 is set to logic "0". FIG. 21 illustrates waveforms of signal lines of the sector SEC0 illustrated in FIG. 20. With respect to the same operations as FIG. 12, detailed descriptions are omitted. FIG. 21 is similar as FIG. 12 except that the unselection source line SL1-3 in the selected sector SEC0 is set to the high level (1.8 V; VCC) during the decoding period PDEC, high voltage supply start period PHV and program period PPGM.

In the decoding period PDEC, the source line driver SLDRV corresponding to the unselection source lines SL1-3 of the sector SEC0 sets the source lines SL1-3 to the high level (1.8 V) (FIG. 21 (*a*)). Similarly as FIG. 12, in the decoding period PDEC and high voltage supply start period PHV, the voltage of the bit line BL1 in the floating state FLT rises due to the current flowing from the source line SL0 via the memory transistor MT4 and selection transistor ST4 illustrated in FIG. 20 (FIG. 21 (*b*)).

The threshold voltage of the memory transistor MT6 has been set as negative (depression state). Therefore, the voltage of the middle node MN between the selection transistor ST6 and memory transistor MT6 illustrated in FIG. 20 becomes gradually equal to the voltage of the source line SL1. At this time, the source voltage of the selection transistor ST6 is the voltage (1.8 V) of the source line SL1. The drain voltage of the selection transistor ST6 is the voltage (3.5 V) of the bit line BL1.

The selection transistor ST6 where the threshold voltage is designed to be low for a high speed operation tends to cause a subthreshold leakage current to flow therein. However, the source voltage (1.8 V) of the selection transistor ST6 is higher than the gate voltage (0 V). Therefore, similarly to making back bias deep, an effectual threshold voltage becomes high. Accordingly, similarly as FIG. 11, this may prevent the leak current from flowing from the bit line BL1 into the source line SL1 via the selection transistor ST6. Blocking-off the leak path from the bit line BL1 to the source line SL1 may enable the high level voltage of the selection gate line SG0 to be set high (for example, 4 V), and at the same time, may enable the high level voltage of the source line SL0 to be maintained. As a result, this may shorten the data program operation time. As mentioned above, the present embodiment may also obtain similar effect as that of the embodiment mentioned above.

Figure 22:
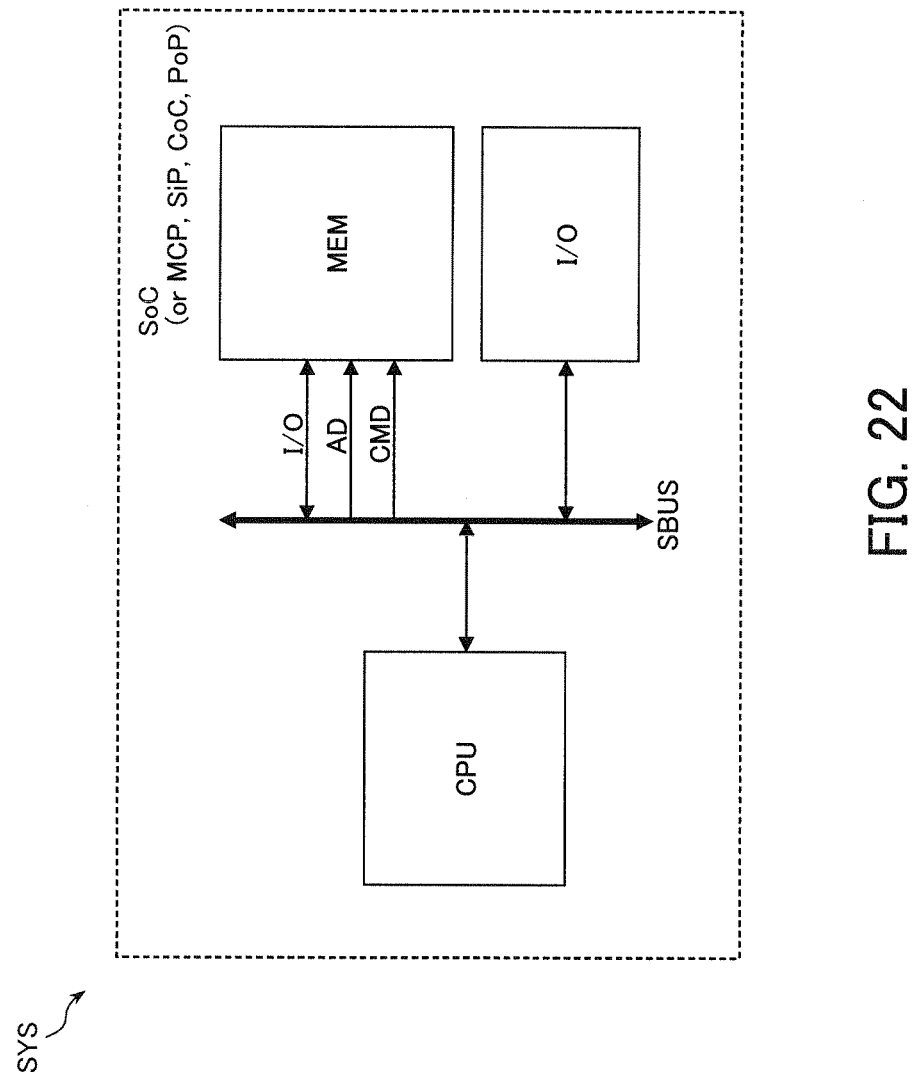
FIG. 22 illustrates an example of a system SYS with the semiconductor memory of the embodiment mentioned above installed thereon.

FIG. 22 illustrates an example of a system SYS with the semiconductor memory of the embodiment mentioned above installed therein. The system SYS (user system) makes up at least a part of a microcomputer system such as portable equipment, for example. The system SYS includes a system-on-chip SoC with a plurality of macros integrated on a silicon substrate. Alternatively, the system SYS may include a multi chip package MCP with a plurality of chips laminated on a package board. Alternatively, the system SYS may include a system in package SiP with a plurality of chips installed on a package board such as a lead frame. Furthermore, the system SYS may be made up of a configuration of a chip on chip CoC or a package on package PoP.

For example, the SoC includes any of the semiconductor memories MEM of the embodiments mentioned above, a CPU (controller) which controls access of the semiconductor memory MEM, and a peripheral circuit I/O. The CPU, semiconductor memory MEM, and peripheral circuit I/O are mutually coupled by a system bus SBUS. The system SYS may have a memory controller disposed between the CPU and the semiconductor memory MEM.

The CPU accesses the semiconductor memory MEM and peripheral circuit I/O, and controls operation of the whole system. The semiconductor memory MEM executes the read operation, program operation and erasure operation according to an access request from the CPU. The minimum configuration of the system SYS includes the CPU which functions as the memory controller, and the semiconductor memory MEM.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory, comprising:
a plurality of nonvolatile memory cells being arranged in a matrix and including memory transistors which are electrically rewritable and selection transistors coupled to the respective memory transistors;
a plurality of control gate lines each coupled to a row of the memory cells aligned in a first direction;
a plurality of selection gate lines each coupled to the row of the memory cells aligned in the first direction;
a plurality of source lines each coupled to the row of the memory cells aligned in the first direction;
a plurality of bit lines each coupled to a column of the selection transistors aligned in a second direction intersecting the first direction;
a control gate line driver setting one of the control gate lines coupled to the row of the memory cells including a program memory cell where data are programmed to a first high level voltage, and setting at least one of the remaining control gate lines coupled to the row of non-program memory cells where data are not programmed to a low level voltage, at a time of program operation;
a selection gate line driver setting one of the selection gate lines coupled to the row of the memory cells including the program memory cell to a second high level voltage, and setting at least one of the remaining selection gate lines coupled to the row of the non-program memory cells to a low level voltage, at the time of program operation;
a bit line control unit setting one of the bit lines coupled to the selection transistors of the column of the memory cells including the program memory cell to a low level voltage, and setting at least one of the remaining bit lines coupled to the selection transistors of the column of the non-program memory cells to a floating state, at the time of program operation; and a plurality of source line drivers coupled to each of the source lines and each including a first transistor coupling one of the source lines to a high level voltage line having a third high level voltage and a second transistor coupling the one of the source lines to a low level voltage line;

one of the source line drivers corresponding to the row of the memory cells including the program memory cell turns-on the first transistor and turns-off the second transistor, at the time of program operation; and at least one of the remaining source line drivers corresponding to the row of the non-program memory cells turns-off the first and the second transistors, at the time of the program operation.

2. The semiconductor memory according to claim 1, wherein
the selection gate line driver, at the time of program operation, sets one of the selection gate lines coupled to the row of the memory cells including the program memory cell to the second high level voltage higher than a power supply voltage.

3. The semiconductor memory according to claim 1, wherein
the source line drivers, at the time of program operation, set at least one of the source lines coupled to the row of the non-program memory cells to a floating state, and
the at least one of the source lines coupled to the row of the non-program memory cells is set, by a current flowing therein from a floating bit line set to the floating state via the memory transistors and the selection transistors of at least one of the non-program memory cells to be higher than the low level voltage of the selection gate lines and lower than a fourth high level voltage of the floating bit line.

4. The semiconductor memory according to claim 1, wherein
the source line drivers each drives one of the source lines coupled to the row of the non-program memory cells to a voltage higher than the low level voltage of the selection gate lines and lower than a fourth high level voltage of a floating bit line set to the floating state, at the time of program operation.

5. The semiconductor memory according to claim 4, wherein:
the control gate line driver, at the time of program operation, sets one of the control gate lines coupled to the row of the memory cells including the program memory cell to the first high level voltage higher than a power supply voltage;
the selection gate line driver, at the time of program operation, sets one of the selection gate lines coupled to the row of the memory cells including the program memory cell to the second high level voltage higher than the power supply voltage; and
each of the source line drivers, at the time of program operation, sets one of the source lines coupled to the row of the memory cells including the program memory cell to the third high level voltage higher than the power supply voltage and sets the at least one of the source lines coupled to the row of the non-program memory cells to the power supply voltage.

6. A semiconductor memory, comprising:
a plurality of nonvolatile memory cells being arranged in a matrix and including memory transistors which are electrically rewritable and selection transistors coupled to the respective memory transistors;
a plurality of control gate lines each coupled to a row of the memory cells aligned in a first direction;
a plurality of selection gate lines each coupled to the row of the memory cells aligned in the first direction;
a plurality of source lines each coupled to the row of the memory cells aligned in the first direction;
a plurality of bit lines each coupled to a column of the selection transistors aligned in a second direction intersecting the first direction;
a control gate line driver setting one of the control gate lines coupled to the row of the memory cells including a program memory cell where data are programmed to a first high level voltage, and setting at least one of the remaining control gate lines coupled to the row of non-program memory cells where data are not programmed to a low level voltage, at a time of program operation;
a selection gate line driver setting one of the selection gate lines coupled to the row of the memory cells including the program memory cell to a second high level voltage, and setting at least one of the remaining selection gate lines coupled to the row of the non-program memory cells to a low level voltage, at the time of program operation;
a bit line control unit setting one of the bit lines coupled to the selection transistors of the column of the memory cells including the program memory cell to a low level voltage, and setting at least one of the remaining bit lines coupled to the selection transistors of the column of the non-program memory cells to a floating state, at the time of program operation; and
a plurality of source line drivers coupled to each of the source lines and each including a first transistor coupling one of the source lines to a first high level voltage line having a third high level voltage, a second transistor coupling the one of the source lines to a second high level voltage line lower than the third high level voltage, and a third transistor coupling the one of the source lines to a low level voltage line;
one of the source line drivers corresponding to the row of the memory cells including the program memory cell turns-on the first transistor and turns off the second and the third transistors, at the time of program operation; and
at least one of the remaining source line drivers corresponding to the row of the non-program memory cells turns-off the first and the third transistors and turns-on the second transistor, at the time of program operation.

7. The semiconductor memory according to claim 6, comprising
source line decoders being provided corresponding to the source line drivers and each receiving a source line address to select one of the source lines, wherein
each of the source line decoders includes a first switch circuit generating a first source control signal to turn on or off the first transistor, and a second switch circuit generating a second source control signal to turn on or off the second transistor and having opposite logic against logic of the first source control signal.

8. A system comprising:
a semiconductor memory; and
a memory controller controlling an access of the semiconductor memory,
the semiconductor memory includes:
a plurality of nonvolatile memory cells being arranged in a matrix and including memory transistors which are electrically rewritable and selection transistors coupled to the respective memory transistors;
a plurality of control gate lines each coupled to a row of the memory cells aligned in a first direction;
a plurality of selection gate lines each coupled to the row of the memory cells aligned in the first direction;
a plurality of source lines each coupled to the row of the memory cells aligned in the first direction;
a plurality of bit lines each coupled to a column of the selection transistors aligned in a second direction intersecting the first direction;
a control gate line driver setting one of the control gate lines coupled to the row of the memory cells including a program memory cell where data are programmed to a first high level voltage, and setting at least one of the remaining control gate lines coupled to the row of non-program memory cells where data are not programmed to a low level voltage, at a time of program operation;
a selection gate line driver setting one of the selection gate lines coupled to the row of the memory cells including the program memory cell to a second high level voltage, and setting at least one of the remaining selection gate lines coupled to the row of the non-program memory cells to a low level voltage, at the time of program operation;
a bit line control unit setting one of the bit lines coupled to the row of the selection transistors of the column of the memory cells including the program memory cell to a low level voltage, and setting at least one of the remaining bit lines coupled to the selection transistors of the column of the non-program memory cells to a floating state, at the time of program operation; and
a plurality of source line drivers coupled to each of the source lines and each including a first transistor coupling one of the source lines to a high level voltage line having a third high level voltage and a second transistor coupling the one of the source lines to a low level voltage line;
one of the source line drivers corresponding to the row of the memory cells including the program memory cell turns-on the first transistor and turns-off the second transistor, at the time of program operation; and
at least one of the remaining source line drivers corresponding to the row of the non-program memory cells turns-off the first and the second transistors, at the time of the program operation.

9. The system according to claim 8, wherein
the selection gate line driver, at the time of program operation, sets one of the selection gate lines coupled to the row of the memory cells including the program memory cell to the second high level voltage higher than a power supply voltage.

10. The system according to claim 8, wherein
the source line drivers, at the time of program operation, set at least one of the source lines coupled to the row of the non-program memory cells to the floating state, and
the at least one of the source lines coupled to the row of the non-program memory cells is set, by a current flowing therein from a floating bit line set to the floating state via the memory transistors and the selection transistors of at least one of the non-program memory cells to be higher than the low level voltage of the selection gate lines and lower than a fourth high level voltage of the floating bit line.

11. The system according to claim 8, wherein
the source line drivers each drives one of the source lines coupled to the row of the non-program memory cells to a voltage higher than the low level voltage of the selection gate lines and lower than a fourth high level voltage of a floating bit line set to the floating state, at the time of program operation.

12. The system according to claim 11, wherein:
the control gate line driver, at the time of program operation, sets one of the control gate lines coupled to the row of the memory cells including the program memory cell to the first high level voltage higher than a power supply voltage;
the selection gate line driver, at the time of program operation, sets one of the selection gate lines coupled to the row of the memory cells including the program memory cell to the second high level voltage higher than the power supply voltage; and
each of the source line drivers, at the time of program operation, sets one of the source lines coupled to the row of the memory cells including the program memory cell to the third high level voltage higher than the power supply voltage and sets the at least one of the source lines coupled to the row of the non-program memory cells to the power supply voltage.

13. A system, comprising:
a semiconductor memory; and
a memory controller controlling an access of the semiconductor memory,
the semiconductor memory includes:
a plurality of nonvolatile memory cells being arranged in a matrix and including memory transistors which are electrically rewritable and selection transistors coupled to the respective memory transistors;
a plurality of control gate lines each coupled to a row of the memory cells aligned in a first direction;
a plurality of selection gate lines each coupled to the row of the memory cells aligned in the first direction;
a plurality of source lines each coupled to the row of the memory cells aligned in the first direction;
a plurality of bit lines each coupled to a column of the selection transistors aligned in a second direction intersecting the first direction;
a control gate line driver setting one of the control gate lines coupled to the row of the memory cells including a program memory cell where data are programmed to a first high level voltage, and setting at least one of the remaining control gate lines coupled to the row of non-program memory cells where data are not programmed to a low level voltage, at a time of program operation;
a selection gate line driver setting one of the selection gate lines coupled to the row of the memory cells including the program memory cell to a second high level voltage, and setting at least one of the remaining selection gate lines coupled to the row of the non-program memory cells to a low level voltage, at the time of program operation;
a bit line control unit setting one of the bit lines coupled to the selection transistors of the column of the memory cells including the program memory cell to a low level voltage, and setting at least one of the remaining bit lines coupled to the selection transistors of the column of the non-program memory cells to a floating state, at the time of program operation; and a plurality of source line drivers coupled to each of the source lines and each including a first transistor coupling one of the source lines to a first high level voltage line having a third high level voltage, a second transistor coupling the one of the source lines to a second high level voltage line lower than the third high level voltage, and a third transistor coupling the one of the source lines to a low level voltage line;

one of the source line drivers corresponding to the row of the memory cells including the program memory cell turns-on the first transistor and turns off the second and the third transistors, at the time of program operation; and at least one of the remaining source line drivers corresponding to the row of the non-program memory cells turns-off the first and the third transistors and turns-on the second transistor, at the time of program operation.

14. The system according to claim 13, comprising source line decoders being provided corresponding to the source line drivers and each receiving a source line address to select one of the source lines, wherein each of the source line decoders includes a first switch circuit generating a first source control signal to turn on or off the first transistor, and a second switch circuit generating a second source control signal to turn on or off the second transistor and having opposite logic against logic of the first source control signal.

* * * * *